(12) United States Patent
Chikaraishi et al.

(10) Patent No.: US 11,913,633 B2
(45) Date of Patent: Feb. 27, 2024

(54) POWER TOOL, LIGHT UNIT, AND FLOODLIGHT

(71) Applicant: MAKITA CORPORATION, Anjo (JP)

(72) Inventors: Makoto Chikaraishi, Anjo (JP); Akihiro Hozumi, Anjo (JP); Kazunori Kinoshita, Anjo (JP)

(73) Assignee: MAKITA CORPORATION, Anjo (JP)

( * ) Notice: Subject to any disclaimer, the term of this patent is extended or adjusted under 35 U.S.C. 154(b) by 0 days.

(21) Appl. No.: 18/193,699

(22) Filed: Mar. 31, 2023

(65) Prior Publication Data

US 2023/0366533 A1 Nov. 16, 2023

(30) Foreign Application Priority Data

May 11, 2022 (JP) ................. 2022-078036

(51) Int. Cl.
| | |
|---|---|
| *F21V 33/00* | (2006.01) |
| *B25F 5/02* | (2006.01) |
| *F21V 29/10* | (2015.01) |
| *H01L 33/64* | (2010.01) |
| *F21Y 115/10* | (2016.01) |
| *F21W 131/10* | (2006.01) |

(52) U.S. Cl.
CPC ............ *F21V 33/0084* (2013.01); *B25F 5/02* (2013.01); *F21V 29/10* (2015.01); *H01L 33/641* (2013.01); *F21W 2131/10* (2013.01); *F21Y 2115/10* (2016.08)

(58) Field of Classification Search
CPC ........ F21V 33/0084; F21V 29/10; B25F 5/02; H01L 33/641; F21Y 2115/10; F21W 2131/10
See application file for complete search history.

(56) References Cited

U.S. PATENT DOCUMENTS

| | | | |
|---|---|---|---|
| 2016/0354889 A1* | 12/2016 | Ely | ................... B23Q 17/2404 |
| 2018/0040927 A1* | 2/2018 | Rejman | ............... H01M 10/482 |
| 2019/0061135 A1* | 2/2019 | Cerfeuillet | ............... B25F 5/02 |
| 2019/0070720 A1* | 3/2019 | Rabe | ....................... B25F 5/001 |
| 2020/0227927 A1* | 7/2020 | Thiele | ................... H02J 7/0048 |

* cited by examiner

*Primary Examiner* — Mary Ellen Bowman
(74) *Attorney, Agent, or Firm* — Oliff PLC

(57) ABSTRACT

A power tool includes: a motor; an output shaft that is rotated by a rotational force of the motor; a chip-on-board light emitting diode disposed around the output shaft; and a suppression device configured to suppress a temperature of the chip-on-board light emitting diode to a predetermined allowable value or less.

22 Claims, 18 Drawing Sheets

POWER TOOL, LIGHT UNIT, AND FLOODLIGHT

CROSS-REFERENCE

The present application claims priority to and incorporates by reference the entire contents of Japanese Patent Application No. 2022-078036 filed in Japan on May 11, 2022.

TECHNICAL FIELD

The technology disclosed in the present specification relates to a power tool, a light unit, and a floodlight.

BACKGROUND ART

In the technical field related to power tools, a known illumination system for a power tool is disclosed in US 2016/0354889 A.

In US 2016/0354889 A, the illumination system for a power tool includes a chip-on-board light emitting diode (COB LED). The chip-on-board light emitting diode emits (outputs) a higher amount of light and brightly illuminates a work target or a work space. On the other hand, since the chip-on-board light emitting diode generates a higher amount of heat, the temperature thereof may excessively rise due to heat inflow from other heat sources or the like. When the temperature of the chip-on-board light emitting diode is excessively increased, the chip-on-board light emitting diode may be deteriorated or the life of the chip-on-board light emitting diode may be shortened.

An object of the present disclosure is to disclose techniques for suppressing an excessive rise in temperature of a chip-on-board light emitting diode.

SUMMARY OF THE INVENTION

In one non-limiting aspect of the present disclosure, a power tool may include: a motor; an output shaft that is rotated by a rotational force of the motor; a chip-on-board light emitting diode disposed around the output shaft; and a suppression device configured to suppress a temperature of the chip-on-board light emitting diode to a predetermined allowable value or less.

DETAILED DESCRIPTION OF THE INVENTION

Figure 1:
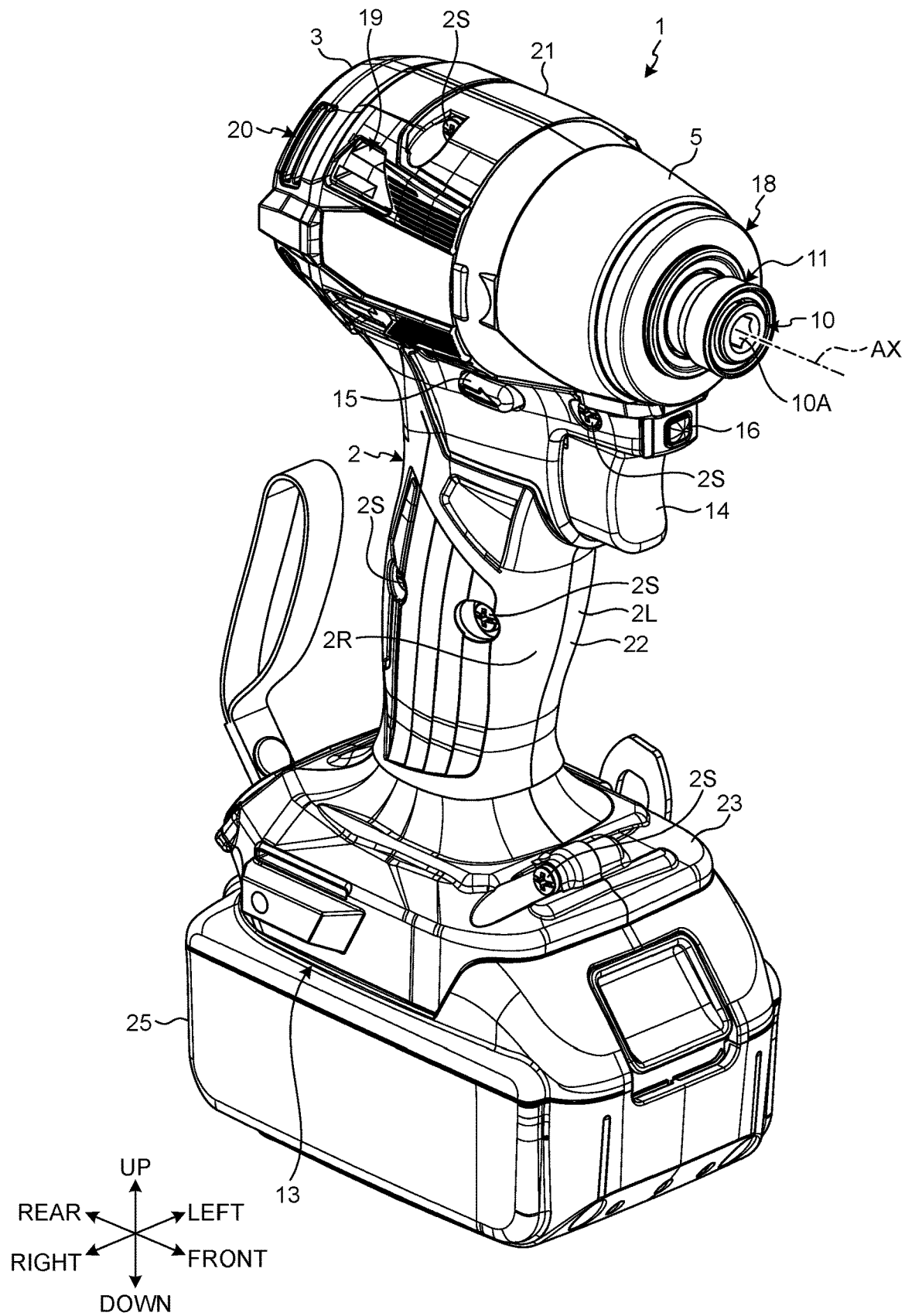
FIG. 1 is an oblique view, viewed from the front, which illustrates a power tool according to a first embodiment.

In one or more embodiments, a power tool may include: a motor; an output shaft that is rotated by a rotational force of the motor; a chip-on-board light emitting diode disposed around the output shaft; and a suppression device configured to suppress a temperature of the chip-on-board light emitting diode to a predetermined allowable value or less.

According to the above configuration, since the temperature of the chip-on-board light emitting diode is suppressed to the predetermined allowable value or less by the suppression device, an excessive rise in temperature of the chip-on-board light emitting diode is suppressed. The predetermined allowable value of the temperature of the chip-on-board light emitting diode may be the heat-resistant temperature of an LED chip of the chip-on-board light emitting diode.

In one or more embodiments, the suppression device may include a heat insulating material disposed on at least a part of a periphery of the chip-on-board light emitting diode.

According to the above configuration, an excessive rise in temperature of the chip-on-board light emitting diode is suppressed by the heat insulating material, and the temperature of the chip-on-board light emitting diode is suppressed to the predetermined allowable value or less. For example, in a case where a heating source is present at least at a part of the periphery of the chip-on-board light emitting diode, the heat insulating material is disposed between the heating source and the chip-on-board light emitting diode, whereby the chip-on-board light emitting diode is prevented from being heated by the heating source. As a result, the temperature of the chip-on-board light emitting diode is suppressed to the allowable value or less.

In one or more embodiments, the heat insulating material may contact the substrate of the chip-on-board light emitting diode.

According to the above configuration, the heat insulating material suppresses an excessive rise in temperature of the chip-on-board light emitting diode.

In one or more embodiments, a heating source may be included in a power tool. The heat insulating material may be disposed between the heating source and the chip-on-board light emitting diode.

According to the above configuration, since the heat insulating material prevents the on-chip light emitting diode from being heated by the heating source, an excessive rise in temperature of the on-chip light emitting diode is suppressed.

In one or more embodiments, the power tool may include a speed reduction mechanism configured to transmit a rotational force of the motor to the output shaft, and a gear case that accommodates therein the speed reduction mechanism. The heating source may include the gear case.

According to the above configuration, heating of the chip-on-board light emitting diode is suppressed by the gear case.

In one or more embodiments, the heat insulating material may be in contact with each of a substrate of the chip-on-board light emitting diode and the gear case.

According to the above configuration, heating of the chip-on-board light emitting diode is suppressed by the gear case.

In one or more embodiments, the heat insulating material may have a sheet shape.

According to the above configuration, in a case where the heat insulating material is a solid heat insulating sheet, the heat insulating sheet can be sandwiched between the substrate of the chip-on-board light emitting diode and the gear case.

In one or more embodiments, the gear case may include: a rear cylindrical portion that accommodates therein the speed reduction mechanism; a front cylindrical portion that holds a bearing that supports the output shaft; and an annular portion that connects a front end portion of the rear cylindrical portion and a rear end portion of the front cylindrical portion. The chip-on-board light emitting diode may be disposed around the front cylindrical portion. The heat insulating material may be disposed between the substrate and the annular portion.

According to the above configuration, an increase in size of the power tool is suppressed, and an excessive rise in temperature of the chip-on-board light emitting diode is suppressed.

In one or more embodiments, the power tool may include a case cover that covers a surface of the rear cylindrical portion. At least a part of the heat insulating material may be disposed between the chip-on-board light emitting diode and the case cover.

According to the above configuration, an excessive rise in temperature of the chip-on-board light emitting diode is suppressed.

In one or more embodiments, the substrate may include a circular ring portion, and an LED chip may be disposed on a front surface of the circular ring portion. The power tool may further include a light cover that includes: an outer cylindrical portion disposed radially outside with respect to the circular ring portion; an inner cylindrical portion disposed radially inside with respect to the circular ring portion; and a light transmission portion that is disposed so as to connect a front end portion of the outer cylindrical portion and a front end portion of the inner cylindrical portion and through which light emitted from the LED chip of the chip-on-board light emitting diode passes.

According to the above configuration, the chip-on-board light emitting diode can illuminate a work target.

In one or more embodiments, the inner cylindrical portion may be disposed around the front cylindrical portion and fixed to the front cylindrical portion.

According to the above configuration, the chip-on-board light emitting diode is fixed to the front cylindrical portion of the gear case via the light cover.

In one or more embodiments, the front cylindrical portion may include a protrusion protruding radially outward from an outer circumferential surface of the front cylindrical portion, and the inner cylindrical portion may include a recess in which the protrusion is disposed.

According to the above configuration, the chip-on-board light emitting diode is fixed to the front cylindrical portion of the gear case via the light cover.

In one or more embodiments, the output shaft may include an anvil. The power tool may include an impact mechanism to which a rotational force of the motor is transmitted via the speed reduction mechanism and that impacts the anvil in a rotation direction. The gear case may be a hammer case that accommodates therein the speed reduction mechanism and the impact mechanism.

According to the above configuration, the chip-on-board light emitting diode is applied to an impact tool.

In one or more embodiments, a light unit may include: a chip-on-board light emitting diode; and an LED control circuit configured to control a light emission state of an LED chip of the chip-on-board light emitting diode such that a temperature of the chip-on-board light emitting diode is equal to or less than a predetermined allowable value.

According to the above configuration, since the temperature of the chip-on-board light emitting diode is suppressed to be equal to or less than the predetermined allowable value by the LED control circuit, an excessive rise in temperature of the chip-on-board light emitting diode is suppressed. The predetermined allowable value of the temperature of the chip-on-board light emitting diode may be the heat-resistant temperature of an LED chip of the chip-on-board light emitting diode.

In one or more embodiments, the light unit may include a temperature sensor that detects a temperature of the chip-on-board light emitting diode. The LED control circuit may decrease an amount of light emitted from the LED chip when determining that the temperature of the chip-on-board light emitting diode exceeds the predetermined allowable value based on detection data of the temperature sensor.

According to the above configuration, when it is determined, based on the detection data of the temperature sensor, that the temperature of the chip-on-board light emitting diode exceeds the allowable value, the amount of light emitted from the LED chip is reduced, whereby the temperature of the chip-on-board light emitting diode is suppressed to be equal to or less than the allowable value.

In one or more embodiments, the temperature sensor may be disposed on a substrate of the chip-on-board light emitting diode or on a circuit board on which the substrate is mounted.

According to the above configuration, the temperature sensor can detect the temperature of the chip-on-board light emitting diode.

In one or more embodiments, the light unit may include a current detection circuit that detects a current supplied to the LED chip, and a determination circuit configured to determine whether a temperature of the chip-on-board light emitting diode exceeds the predetermined allowable value based on detection data of the current detection circuit. The LED control circuit may reduce an amount of light emitted from the LED chip when the determination circuit determines that the temperature of the chip-on-board light emitting diode exceeds the allowable value.

According to the above configuration, the temperature of the chip-on-board light emitting diode is estimated based on, for example, a time integral value of the current supplied to the LED chip. When it is determined that the estimated temperature of the chip-on-board light emitting diode exceeds the allowable value, the amount of light emitted from the LED chip is reduced, whereby the temperature of the chip-on-board light emitting diode is suppressed to the allowable value or less.

In one or more embodiments, the LED control circuit may be disposed on a substrate of the chip-on-board light emitting diode or on a circuit board on which the substrate is mounted.

According to the above configuration, an increase in size of the light unit is suppressed.

In one or more embodiments, the light unit may be applied to a floodlight or a power tool.

Hereinafter, embodiments will be described with reference to the drawings. In the embodiments, a positional relationships among parts will be described using the terms "left", "right", "front", "rear", "up", and "down". These terms indicate the relative positions or directions, using the center of a power tool as a reference.

First Embodiment

Power Tool

Figure 2:
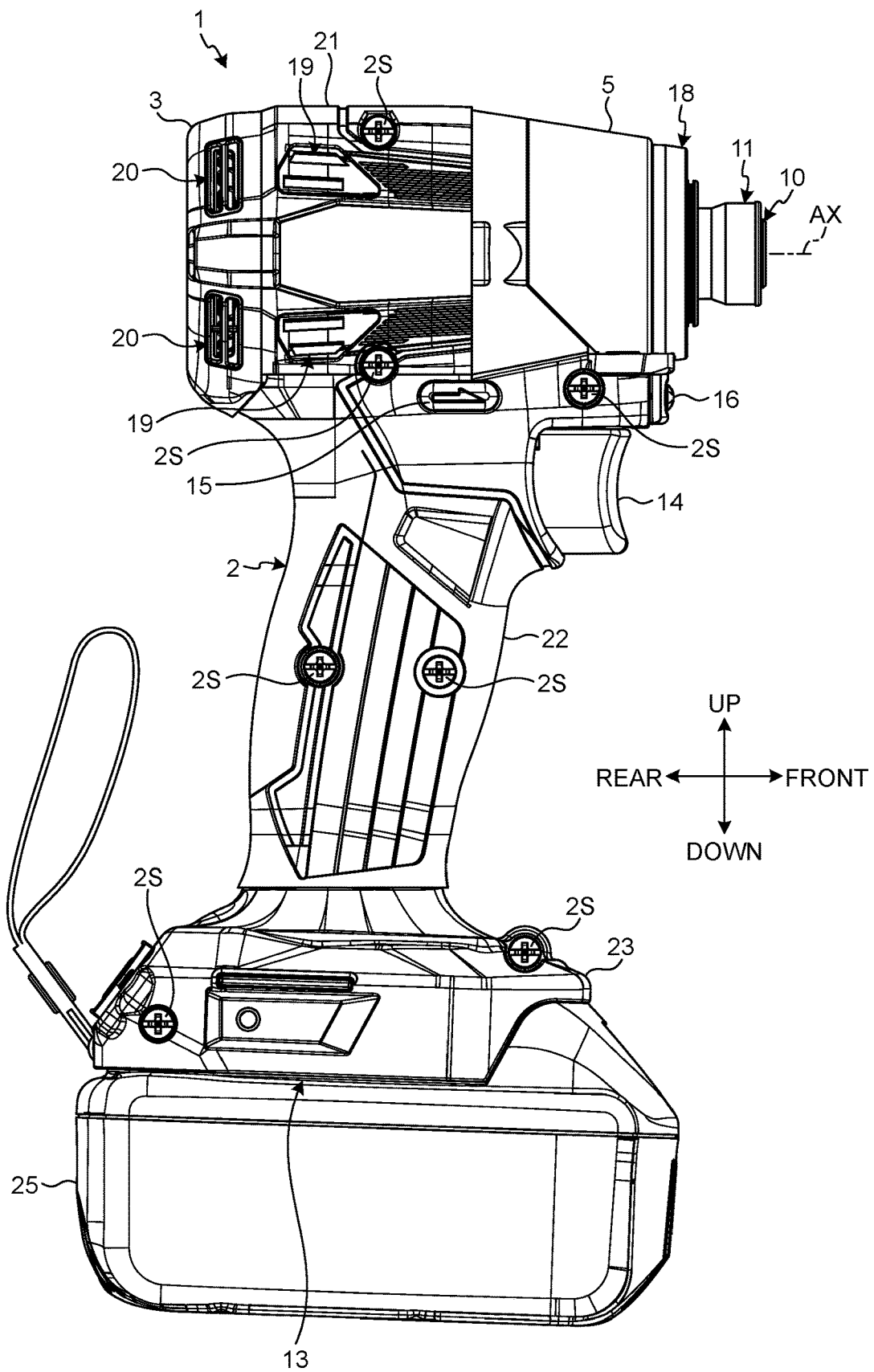
FIG. 2 is a side view illustrating the power tool according to the first embodiment.
Figure 3:
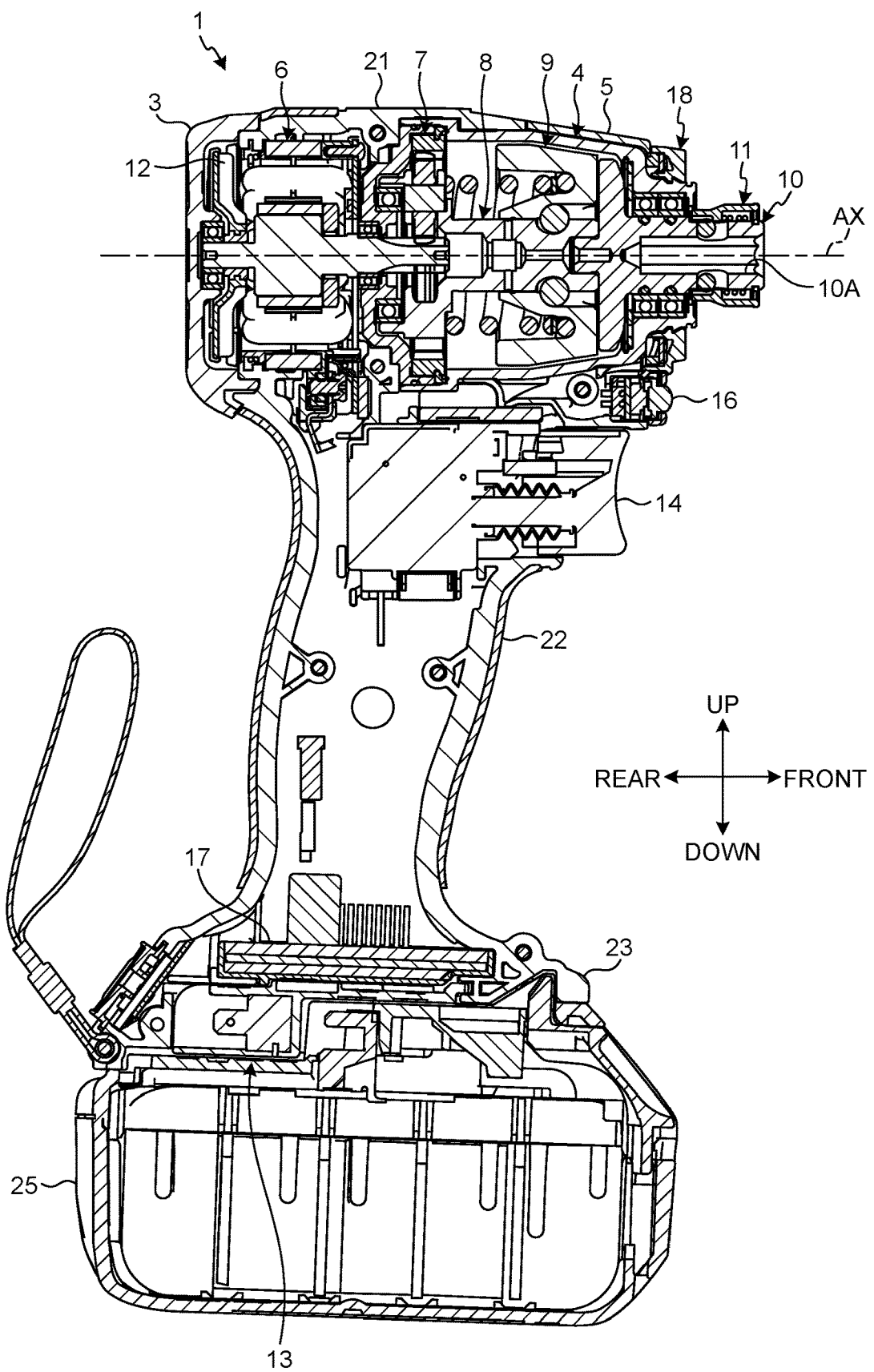
FIG. 3 is a cross-sectional view illustrating the power tool according to the first embodiment.
Figure 4:
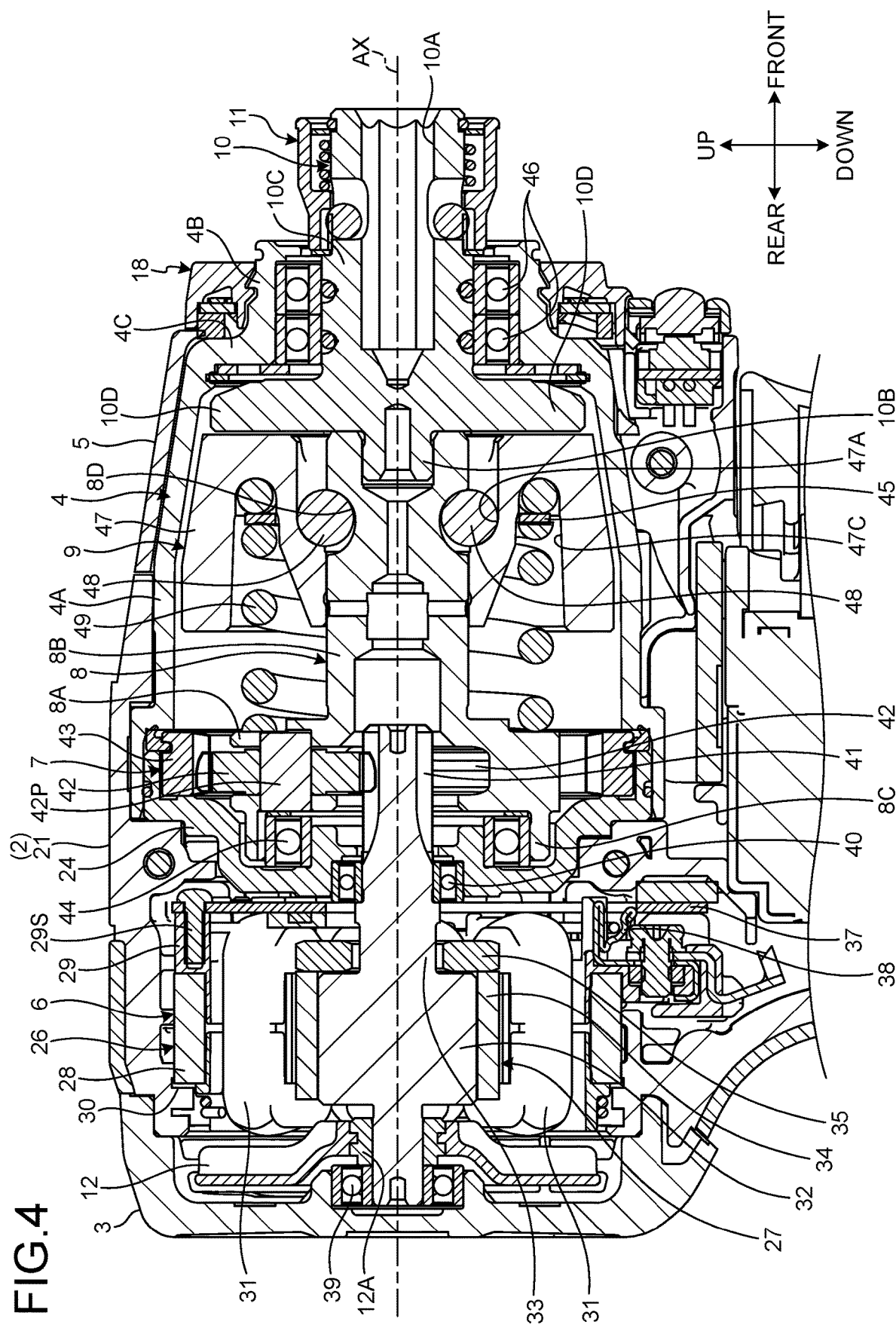
FIG. 4 is a cross-sectional view illustrating an upper portion of the power tool according to the first embodiment.

FIG. 1 is an oblique view, viewed from the front, which illustrates a power tool 1 according to the present embodiment. FIG. 2 is a side view illustrating the power tool 1 according to the present embodiment. FIG. 3 is a cross-sectional view illustrating the power tool 1 according to the present embodiment. FIG. 4 is a cross-sectional view illustrating an upper portion of the power tool 1 according to the present embodiment.

In the present embodiment, the power tool 1 is a power tool having an electric motor 6 as a power source. A direction parallel to a rotation axis AX of the motor 6 is appropriately referred to as an axial direction, a direction around the rotation axis AX is appropriately referred to as a circumferential direction or a rotation direction, and a radial direction of the rotation axis AX is appropriately referred to as a radial direction. In the radial direction, a position close to or a direction approaching the rotation axis AX is appropriately referred to as radially inward, and a position far from or a direction away from the rotation axis AX is appropriately referred to as radially outward. In the present embodiment, the rotation axis AX extends in a front-rear direction. One side in the axial direction is a front side, and the other side in the axial direction is a rear side.

In the present embodiment, the power tool 1 is an impact tool which is a type of power tool. In the following description, the power tool 1 is appropriately referred to as an impact tool 1.

In the present embodiment, the impact tool 1 is an impact driver which is a type of screw fastening tool. The impact tool 1 includes a housing 2, a rear cover 3, a hammer case 4, a case cover 5, the motor 6, a speed reduction mechanism 7, a spindle 8, an impact mechanism 9, an anvil 10, a tool holding mechanism 11, a fan 12, a battery mounting unit 13, a trigger lever 14, a forward/reverse switching lever 15, a hand mode switching button 16, a controller 17, and a light unit 18.

The housing 2 is made of synthetic resin. In the present embodiment, the housing 2 is made of nylon. The housing 2 includes a left housing 2L and a right housing 2R disposed on a right side of the left housing 2L. The left housing 2L and the right housing 2R are fixed by a plurality of screws 2S. The housing 2 includes a pair of half-split housings.

The housing 2 includes a motor housing portion 21, a grip portion 22, and a battery holder 23.

The motor housing portion 21 is cylindrical. The motor housing portion 21 houses therein the motor 6, a part of a bearing box 24, and a rear portion of the hammer case 4.

The grip portion 22 protrudes downward from the motor housing portion 21. The trigger lever 14 is provided above the grip portion 22. The grip portion 22 is held by an operator.

The battery holder 23 is connected to a lower end portion of the grip portion 22. In each of the front-rear direction and the left-right direction, an outer dimension of the battery holder 23 is larger than an outer dimension of the grip portion 22.

The rear cover 3 is made of synthetic resin. The rear cover 3 is disposed rearward of the motor housing portion 21. The rear cover 3 houses at least a part of the fan 12. The fan 12 is disposed on an inner-circumference side of the rear cover 3. The rear cover 3 is disposed such that it covers an opening in a rear end portion of the motor housing portion 21.

The motor housing portion 21 has air-intake ports 19. The rear cover 3 has air-exhaust ports 20. Air from outside of the housing 2 flows into an interior space of the housing 2 via the air-intake ports 19. Air from the interior space of the housing 2 flows out to the outside of the housing 2 via the air-exhaust ports 20.

The hammer case 4 functions as a gear case that accommodates therein the speed reduction mechanism 7. The hammer case 4 accommodates therein at least a part of the speed reduction mechanism 7, the spindle 8, the impact mechanism 9, and the anvil 10. The hammer case 4 is made of a metal. In the present embodiment, the hammer case 4 is made of aluminum. The hammer case 4 has a cylindrical shape.

The hammer case 4 includes a rear cylindrical portion 4A, a front cylindrical portion 4B, and an annular portion 4C. The front cylindrical portion 4B is disposed in front of the rear cylindrical portion 4A. An outer diameter of the rear cylindrical portion 4A is larger than an outer diameter of the front cylindrical portion 4B. An inner diameter of the rear cylindrical portion 4A is larger than an inner diameter of the front cylindrical portion 4B. The annular portion 4C is disposed so as to connect a front end portion of the rear cylindrical portion 4A and a rear end portion of the front cylindrical portion 4B.

The hammer case 4 is connected to a front portion of the motor housing portion 21. The bearing box 24 is fixed to a rear portion of the rear cylindrical portion 4A. At least a part of the speed reduction mechanism 7 is disposed inside the bearing box 24. A screw thread is formed on an outer-circumferential portion of the bearing box 24. A screw groove is formed in an inner-circumferential portion of the rear portion of the rear cylindrical portion 4A. The bearing box 24 and the hammer case 4 are fixed to one another by joining the screw thread of the bearing box 24 and the screw groove of the rear cylindrical portion 4A. The hammer case 4 is sandwiched between the left housing 2L and the right housing 2R. A part of the bearing box 24 and the rear portion of the rear cylindrical portion 4A are housed in the motor housing portion 21. The bearing box 24 is fixed to the motor housing portion 21 and the hammer case 4.

The case cover 5 covers at least a part of a surface of the hammer case 4. In the present embodiment, the case cover 5 covers a surface of the rear cylindrical portion 4A. The case cover 5 is made of synthetic resin. In the present embodiment, the case cover 5 is made of polycarbonate resin. The case cover 5 protects the hammer case 4. The case cover 5 blocks contact between the hammer case 4 and an object around the impact tool 1. The case cover 5 blocks contact between the hammer case 4 and the operator.

The motor 6 is a power source of the impact tool 1. The motor 6 generates a rotational force. The motor 6 is an electric motor. The motor 6 is an inner-rotor-type brushless motor. The motor 6 includes a stator 26 and a rotor 27. The stator 26 is supported by the motor housing portion 21. At least a part of the rotor 27 is disposed inside the stator 26. The rotor 27 rotates relative to the stator 26. The rotor 27 rotates about the rotation axis AX extending in the front-rear direction.

The stator 26 includes a stator core 28, a front insulator 29, a rear insulator 30, and coils 31.

The stator core 28 is disposed radially outside with respect to the rotor 27. The stator core 28 includes a plurality of laminated steel plates. The steel plates are plates made of a metal containing iron as a main component. The stator core 28 has cylindrical shape. The stator core 28 includes teeth that respectively support the coils 31.

The front insulator 29 is provided at a front portion of the stator core 28. The rear insulator 30 is provided at a rear portion of the stator core 28. The front insulator 29 and the rear insulator 30 each are an electrically insulating member made of a synthetic resin. The front insulator 29 is disposed so as to cover some of the teeth surfaces. The rear insulator 30 is disposed so as to cover some of the teeth surfaces.

The coils 31 are mounted on the stator core 28 via the front insulator 29 and the rear insulator 30. The coils 31 are disposed around the teeth of the stator core 28 via the front insulator 29 and the rear insulator 30. The coils 31 and the stator core 28 are electrically insulated from one another by the front insulator 29 and the rear insulator 30. The coils 31 are electrically connected via a fusing terminal 38.

The rotor 27 rotates about the rotation axis AX. The rotor 27 includes a rotor core portion 32, a rotor shaft portion 33, at least one rotor magnet 34, and at least one sensor magnet 35.

The rotor core portion 32 and the rotor shaft portion 33 each are made of steel. In the present embodiment, the rotor core portion 32 and the rotor shaft portion 33 are integrated. A front portion of the rotor shaft portion 33 protrudes forward from a front end surface of the rotor core portion 32. A rear portion of the rotor shaft portion 33 protrudes rearward from a rear end surface of the rotor core portion 32.

The rotor magnet 34 is fixed to the rotor core portion 32. The rotor magnet 34 has a cylindrical shape. The rotor magnet 34 is disposed around the rotor core portion 32.

The sensor magnet 35 is fixed to the rotor core portion 32. The sensor magnet 35 has a circular ring shape. The sensor magnet 35 is disposed on the front end surface of the rotor core portion 32 and the front end surface of the rotor magnet 34.

A sensor substrate 37 is mounted on the front insulator 29. The sensor substrate 37 is fixed to the front insulator 29 by at least one screw 29S. The sensor substrate 37 includes a circular circuit board and a magnetic sensor supported by the circuit board. At least a part of the sensor substrate 37 faces the sensor magnet 35. The magnetic sensor detects a position of the sensor magnet 35 to detect a position of the rotor 27 in the rotation direction.

The rear portion of the rotor shaft portion 33 is rotatably supported by a rotor bearing 39. The front portion of the rotor shaft portion 33 is rotatably supported by a rotor bearing 40. The rotor bearing 39 is held by the rear cover 3. The rotor bearing 40 is held by the bearing box 24. The front end portion of the rotor shaft portion 33 is disposed in the interior space of the hammer case 4 through an opening of the bearing box 24.

A pinion gear 41 is formed at a front end portion of the rotor shaft portion 33. The pinion gear 41 is connected to at least a part of the speed reduction mechanism 7. The rotor shaft portion 33 is connected to the speed reduction mechanism 7 via the pinion gear 41.

The speed reduction mechanism 7 transmits a rotational force of the motor 6 to the spindle 8 and the anvil 10. The speed reduction mechanism 7 is accommodated in the rear cylindrical portion 4A of the hammer case 4. The speed reduction mechanism 7 includes a plurality of gears. The speed reduction mechanism 7 is disposed forward of the motor 6. The speed reduction mechanism 7 connects the rotor shaft portion 33 and the spindle 8. The gears of the speed reduction mechanism 7 are driven by the rotor 27. The speed reduction mechanism 7 transmits the rotation of the rotor 27 to the spindle 8. The speed reduction mechanism 7 causes the spindle 8 to rotate at a rotation speed that is lower than a rotation speed of the rotor shaft portion 33. The speed reduction mechanism 7 includes a planetary gear mechanism.

The speed reduction mechanism 7 includes a plurality of planetary gears 42 disposed around the pinion gear 41, and an internal gear 43 disposed around the plurality of planetary gears 42. The pinion gear 41, the planetary gears 42, and the internal gear 43 are each housed in the hammer case 4 and the bearing box 24. Each of the planetary gears 42 meshes with the pinion gear 41. The planetary gears 42 are rotatably supported on the spindle 8 via pins 42P. The spindle 8 is rotated by the planetary gears 42. The internal gear 43 has internal teeth, which mesh with the planetary gears 42. The internal gear 43 is fixed to the bearing box 24. The internal gear 43 is always non-rotatable relative to the bearing box 24.

When the rotor shaft portion 33 rotates in response to the driving of the motor 6, the pinion gear 41 rotates, and the planetary gears 42 revolve around the pinion gear 41. The planetary gears 42 revolve while meshing with the internal teeth of the internal gear 43. Owing to the revolving of the planetary gears 42, the spindle 8, which is connected to the planetary gears 42 via the pin 42P, rotates at a rotation speed that is lower than a rotation speed of the rotor shaft portion 33.

The spindle 8 is rotated by the rotational force of the motor 6. The spindle 8 is disposed forward of at least a part of the motor 6. The spindle 8 is disposed forward of the stator 26. At least a part of the spindle 8 is disposed forward of the rotor 27. At least a part of the spindle 8 is disposed forward of the speed reduction mechanism 7. The spindle 8 is rotated by the rotor 27. The spindle 8 is rotated by a rotational force of the rotor 27 transmitted by the speed reduction mechanism 7.

The spindle 8 includes a flange portion 8A and a spindle shaft portion 8B protruding forward from the flange portion 8A. The planetary gears 42 are rotatably supported by the flange portion 8A via the pins 42P. A rotation axis of the spindle 8 and the rotation axis AX of the motor 6 coincide with one another. The spindle 8 rotates about the rotation axis AX.

The spindle 8 is rotatably supported by a spindle bearing 44. The spindle bearing 44 is held by the bearing box 24. The spindle 8 has a circular ring portion 8C protruding rearward from a rear portion of the flange portion 8A. The spindle bearing 44 is disposed inside the circular ring portion 8C. In the present embodiment, an outer ring of the spindle bearing 44 is connected to the circular ring portion 8C, and an inner ring of the spindle bearing 44 is supported by the bearing box 24.

The impact mechanism 9 is driven by the motor 6. The rotational force of the motor 6 is transmitted to the impact mechanism 9 via the speed reduction mechanism 7 and the spindle 8. The impact mechanism 9 impacts the anvil 10 in the rotation direction owing to the rotational force of the spindle 8, which is rotated by the motor 6. The impact mechanism 9 includes a hammer 47, balls 48, and a coil spring 49. The impact mechanism 9 including the hammer 47 is housed in the hammer case 4.

The hammer 47 is disposed forward of the speed reduction mechanism 7. The hammer 47 is accommodated in the rear cylindrical portion 4A. The hammer 47 is disposed around the spindle shaft portion 8B. The hammer 47 is held by the spindle shaft portion 8B. The balls 48 are disposed between the spindle shaft portion 8B and the hammer 47. The coil spring 49 is supported by the flange portion 8A and the hammer 47.

The hammer 47 is rotated by the motor 6. The rotational force of the motor 6 is transmitted to the hammer 47 via the speed reduction mechanism 7 and the spindle 8. The hammer 47 is rotatable together with the spindle 8 owing to the rotational force of the spindle 8, which is rotated by the motor 6. A rotation axis of the hammer 47, the rotation axis of the spindle 8, and the rotation axis AX of the motor 6 coincide with one another. The hammer 47 rotates about the rotation axis AX.

The balls 48 are made of a metal such as steel. The balls 48 are disposed between the spindle shaft portion 8B and the hammer 47. The spindle 8 has a spindle groove 8D in which at least a part of the ball 48 is disposed. The spindle groove 8D is provided on a part of an outer surface of the spindle shaft portion 8B. The hammer 47 has a hammer groove 47A in which at least a part of the ball 48 is disposed. The hammer groove 47A is provided on a part of an inner surface of the hammer 47. The balls 48 are disposed between the spindle groove 8D and the hammer groove 47A. The balls 48 can roll along the inner side of the spindle groove 8D and the inner side of the hammer groove 47A. The hammer 47 is movable as the balls 48 roll. The spindle 8 and the hammer 47 can move relative to one another in the axial direction and the rotation direction within movable ranges defined by the spindle groove 8D and the hammer groove 47A.

The coil spring 49 generates an elastic (spring) force, which causes the hammer 47 to move forward. The coil spring 49 is disposed between the flange portion 8A and the hammer 47. A ring-shaped recess 47C is provided on a rear surface of the hammer 47. The recess 47C is recessed forward from the rear surface of the hammer 47. A washer is provided on an inner side of the recess 47C. A rear end portion of the coil spring 49 is supported by the flange portion 8A. A front end portion of the coil spring 49 is disposed on the inner side of the recess 47C and is supported by the washer 45.

The anvil 10 is an output shaft of the impact tool 1 that rotates by the rotational force of the motor 6. At least a part of the anvil 10 is disposed forward of the hammer 47. The anvil 10 has a tool (bit) hole 10A into which a tool accessory, e.g., a bit, is inserted. The tool hole 10A is provided at a front end portion of the anvil 10. The tool accessory is mounted on the anvil 10. Furthermore, a protrusion 10B is provided at a rear end portion of the anvil 10. A recess is provided at a front end portion of the spindle shaft portion 8B. The protrusion 10B is inserted into the recess provided at the front end portion of the spindle shaft portion 8B.

The anvil 10 includes a rod-shaped anvil shaft portion 10C and an anvil projection 10D. The tool hole 10A is provided in a front end portion of the anvil shaft portion 10C. The tool accessory is mounted in (on) the anvil shaft portion 10C. The anvil projection 10D is provided at a rear end portion of the anvil 10. The anvil projection 10D projects radially outward from a rear end portion of the anvil shaft portion 10C.

The anvil 10 is rotatably supported by an anvil bearings 46. A rotation axis of the anvil 10, the rotation axis of the hammer 47, the rotation axis of the spindle 8, and the rotation axis AX of the motor 6 coincide with one another. The anvil 10 rotates about the rotation axis AX. The anvil bearings 46 are disposed in the interior of the front cylindrical portion 4B. The anvil bearings 46 are held by the front cylindrical portion 4B of the hammer case 4. The anvil bearings 46 support the anvil shaft portion 10C. In the present embodiment, two anvil bearings 46 are disposed in the front-rear direction.

At least a part of the hammer 47 is capable of coming into contact with the anvil projection 10D. A hammer projection projecting forward is provided at a front portion of the hammer 47. The hammer projection of the hammer 47 and the anvil projection 10D are capable of coming into contact with one another. When the motor 6 is driven (supplied with current) in a state where the hammer 47 and the anvil projection 10D are in contact with one another, the anvil 10 rotates together with the hammer 47 and the spindle 8.

The anvil 10 is impactable (strikable) in the rotation direction by the hammer 47. For example, during screw-fastening work, there are situations in which, when a load that acts on the anvil 10 becomes high, the anvil 10 can no longer be caused to rotate merely by the power generated by the motor. When the anvil 10 can no longer be caused to rotate merely by the power generated by the motor 6, the rotation of the anvil 10 and the hammer 47 will (temporarily) stop. As a result, the spindle 8 and the hammer 47 will move relative to one another in the axial direction and the circumferential direction via the balls 48. That is, even when the rotation of the hammer 47 (temporarily) stops, the rotation of the spindle 8 continues owing to the power generated by the motor 6. In the state where the rotation of the hammer 47 has stopped, when the spindle 8 rotates relative to the hammer 47, the balls 48 move rearward while being guided by the spindle groove 8D and the hammer groove 47A. The hammer 47 receives a force from the balls 48 and moves rearward along with the balls 48. That is, in a state where the rotation of the anvil 10 is stopped, the hammer 47 moves rearward in response to the rotation of the spindle 8. The contact between the hammer 47 and the anvil projection 10D is released by the movement of the hammer 47 rearward.

The coil spring 49 generates an elastic (spring) force, which causes the hammer 47 to move forward. The hammer 47, which had previously moved rearward, now moves forward owing to the elastic force of the coil spring 49. When the hammer moves forward, the hammer 47 receives a force in the rotation direction from the balls 48. That is, the hammer 47 moves forward while rotating. When the hammer 47 moves forward while rotating, the hammer 47 comes into contact with the anvil projection 10D while rotating. As a result, the anvil projection 10D is impacted in the rotation direction by the hammer 47. Both the power of the motor 6 and the inertial force of the hammer 47 act on the anvil 10. Therefore, the anvil 10 can be rotated about the rotation axis AX with a high torque.

The tool holding mechanism 11 is disposed around the front portion of the anvil 10. The tool holding mechanism 11 holds the tool accessory, which is inserted into the tool hole 10A.

The fan 12 is rotated by the rotational force of the motor 6. The fan 12 is disposed rearward of the stator 26 of the motor 6. The fan 12 generates an airflow for cooling the motor 6. The fan 12 is fixed to at least a part of the rotor 27. The fan 12 is fixed to the rear portion of the rotor shaft portion 33 via a bush 12A. The fan 12 is disposed between the rotor bearing 39 and the stator 26. The fan 12 rotates when the rotor 27 rotates. When the rotor shaft portion 33 rotates, the fan 12 rotates together with the rotor shaft portion 33. When the fan 12 rotates, air from outside of the housing 2 flows into the interior space of the housing 2 through the air-intake ports 19. The air that has flowed into the interior space of the housing 2 flows through the interior space of the housing 2, thereby cooling the motor 6. The air that has flowed through the interior space of the housing 2 flows out to the outside of the housing 2 via the air-exhaust ports 20 while the fan 12 is rotating.

The battery mounting unit 13 is disposed at a lower portion of the battery holder 23. The battery mounting unit 13 is connected to a battery pack 25. The battery pack 25 is mounted on the battery mounting unit 13. The battery pack 25 is detachable from the battery mounting unit 13. The battery pack 25 functions as a power supply of the impact tool 1. The battery pack 25 includes one or more secondary batteries. In the present embodiment, the battery pack 25 includes one or more rechargeable lithium-ion batteries. After being mounted on the battery mounting unit 13, the battery pack 25 can supply electric power to the impact tool 1. The motor 6 and the light unit 18 is driven based on the electric power (current) supplied from the battery pack 25.

The trigger lever 14 is provided on the grip portion 22. The trigger lever 14 is operated by an operator to start the motor 6. The motor 6 is changed between driving and stoppage in response to operation of the trigger lever 14.

The forward/reverse switching lever 15 is provided at an upper portion of the grip portion 22. The forward/reverse switching lever 15 is operated by an operator. In response to the operation of the forward/reverse switching lever 15, the rotation direction of the motor 6 is changed from one of a forward-rotational direction and a reverse-rotational direction to the other. When the rotation direction of the motor 6 is changed, the rotational direction of the spindle 8 is changed.

The hand mode switching button 16 is provided at an upper portion of the trigger lever 14. The hand mode switching button 16 can be operated (pressed) by an operator. A control mode of the motor 6 is changed in response to the operation of the hand mode switching button 16.

The controller 17 outputs control signals, which control at least the motor 6 and the light unit 18. The controller 17 is accommodated in the battery holder 23. The controller 17 changes the control mode of the motor 6 based on the work content required to be performed by the impact tool 1. The control mode of the motor 6 refers to a control method or a control pattern of the motor 6. The controller 17 includes a circuit board on which a plurality of electronic components are mounted. Examples of the electronic components mounted on the circuit board include: a processor such as a central processing unit (CPU); nonvolatile memory such as a read only memory (ROM) or storage; volatile memory such as a random access memory (RAM); transistors, and resistors.

Light Unit

The light unit 18 emits illumination light. The light unit 18 illuminates the anvil 10 and the periphery of the anvil 10 with illumination light. The light unit 18 illuminates the front of the anvil 10 with illumination light. Furthermore, the light unit 18 illuminates the tool accessory attached to the anvil 10 and the periphery of the tool accessory with illumination light.

The light unit 18 is disposed at the front portion of the hammer case 4. The light unit 18 is disposed around the front cylindrical portion 4B.

The light unit 18 includes a chip-on-board light emitting diode (COB LED).

Figure 5:
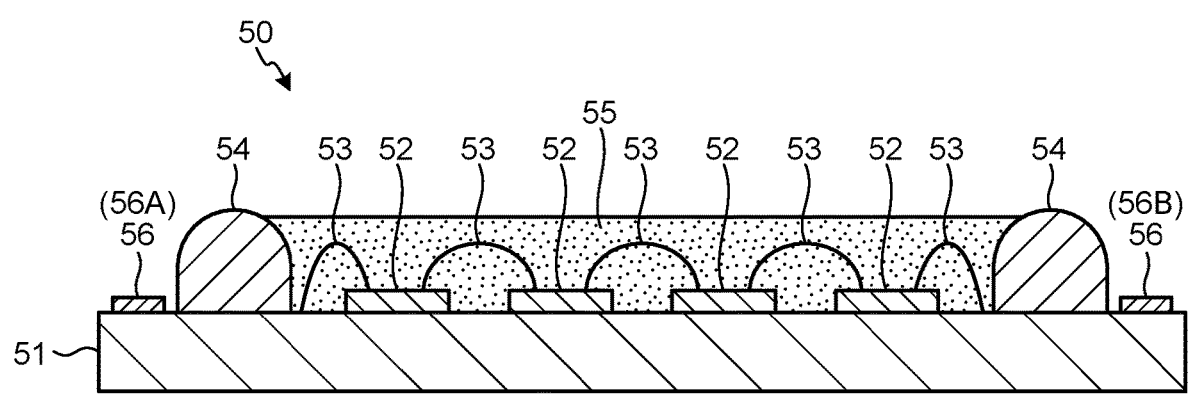
FIG. 5 is a diagram schematically illustrating a chip-on-board light emitting diode according to the first embodiment.

FIG. 5 is a diagram schematically illustrating a chip-on-board light emitting diode 50 according to the present embodiment. The chip-on-board light emitting diode 50 includes a substrate 51, LED chips 52, gold wires 53, a bank 54, a phosphor (phosphor coating) 55, and a pair of electrodes 56. Examples of the substrate 51 include: an aluminum substrate, a woven fiberglass reinforced epoxy substrate (FR-4 substrate), and a composite epoxy material substrate (CEM-3 substrate). The LED chips 52 are mounted on a surface of the substrate 51. The gold wires 53 connect the LED chips 52 and the substrate 51. The gold wires 53 connect the LED chips 52 to one another. The bank 54 is provided on the surface of the substrate 51. The bank 54 is disposed around the LED chips 52. The bank 54 defines a compartment space in which the phosphor 55 is disposed. The phosphor 55 is disposed on the inner side of the bank 54 so as to cover the LED chips 52. Each of the electrodes 56 is disposed on the surface of the substrate 51 on the outer side of the bank 54. The electrodes 56 may be disposed on a back surface of the substrate 51. Among the electrodes 56, one electrode 56 is a positive electrode 56A, and the other electrode 56 is a negative electrode 56B. The electrodes 56 are connected to the battery pack 25 via the controller 17 and lead wires. The power output from the battery pack 25 is supplied to the electrodes 56 via the controller 17 and the lead wires. The power supplied to the electrodes 56 is supplied to the LED chips 52 via the substrate 51 and the gold wires 53. The LED chips 52 emit light owing to the power supplied from the battery pack 25. A voltage, which has been stepped down to 5 V, of the battery pack 25 is applied to the LED chips 52.

Figure 6:
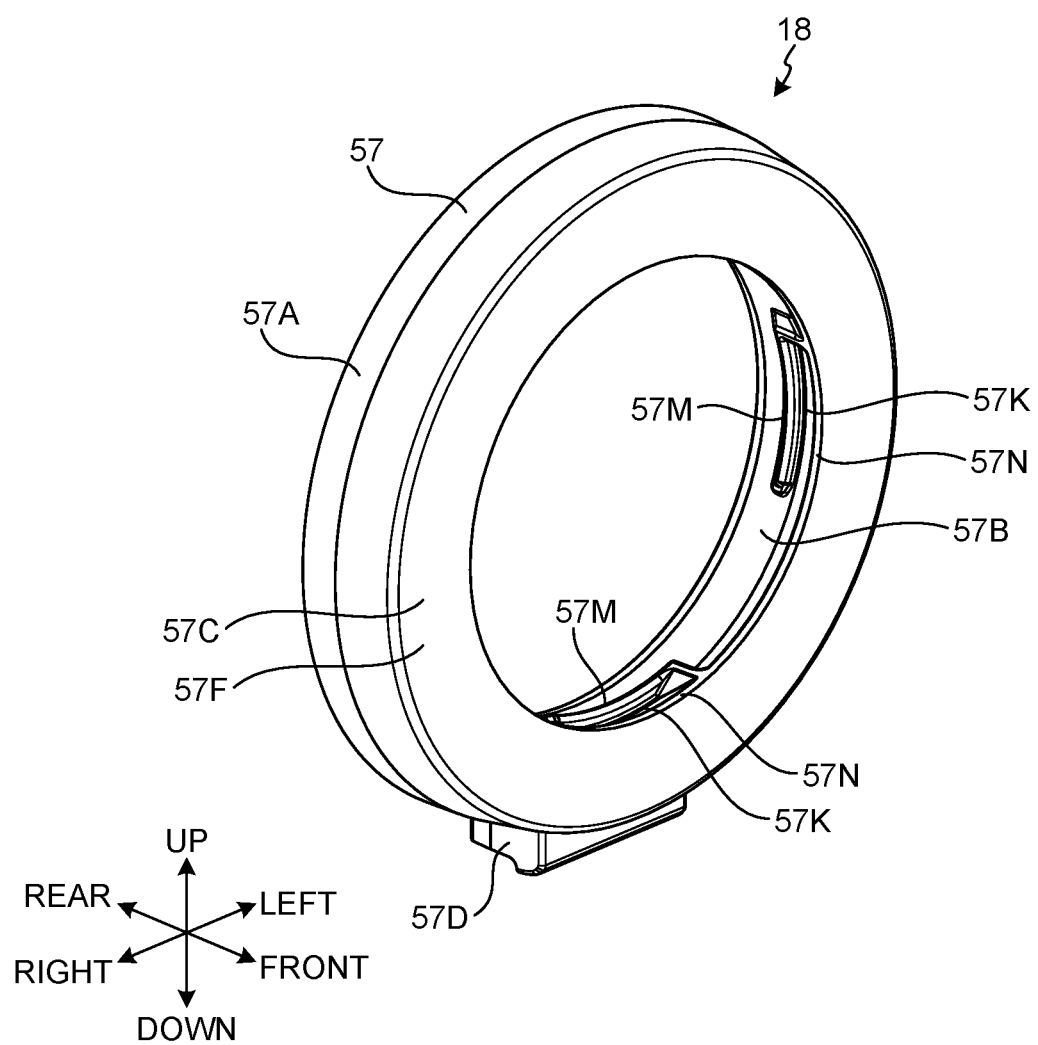
FIG. 6 is an oblique view, viewed from the front, which illustrates a light unit according to the first embodiment.
Figure 7:
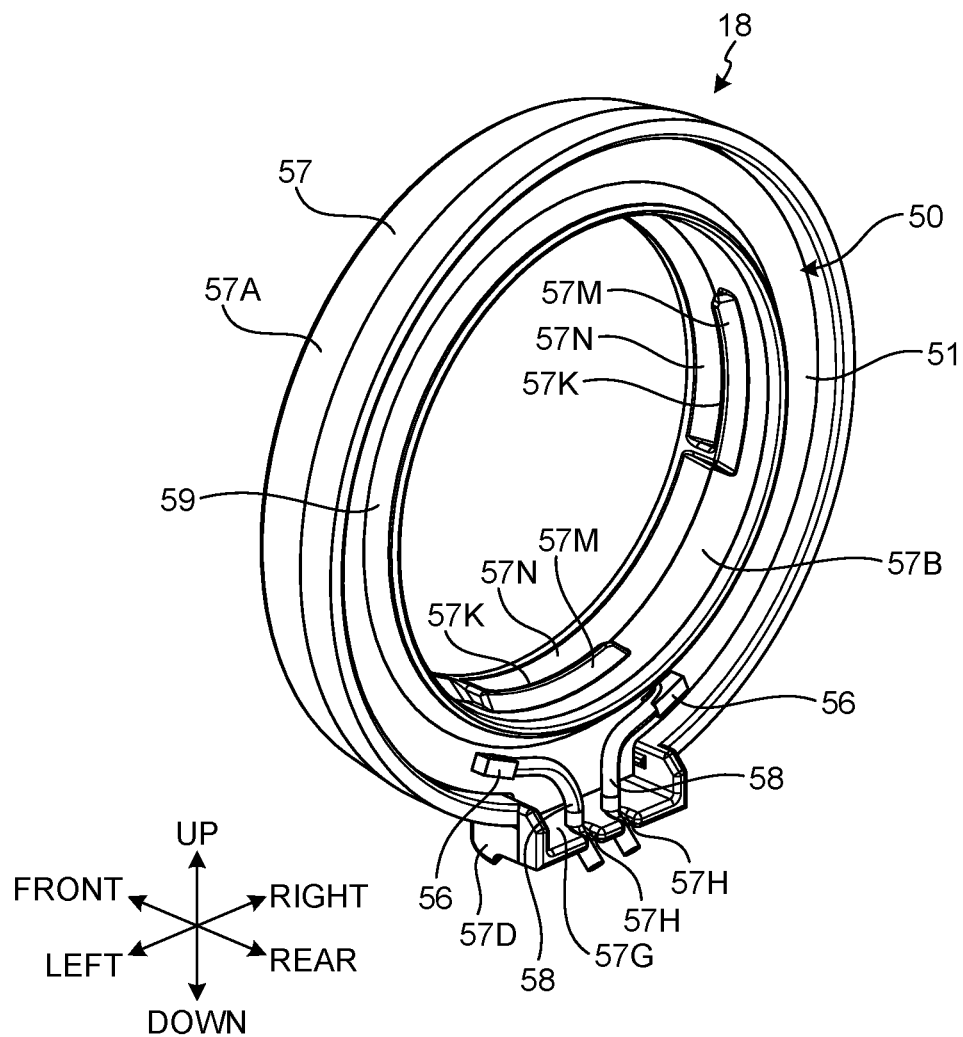
FIG. 7 is an oblique view, viewed from the rear, which illustrates the light unit according to the first embodiment.
Figure 8:
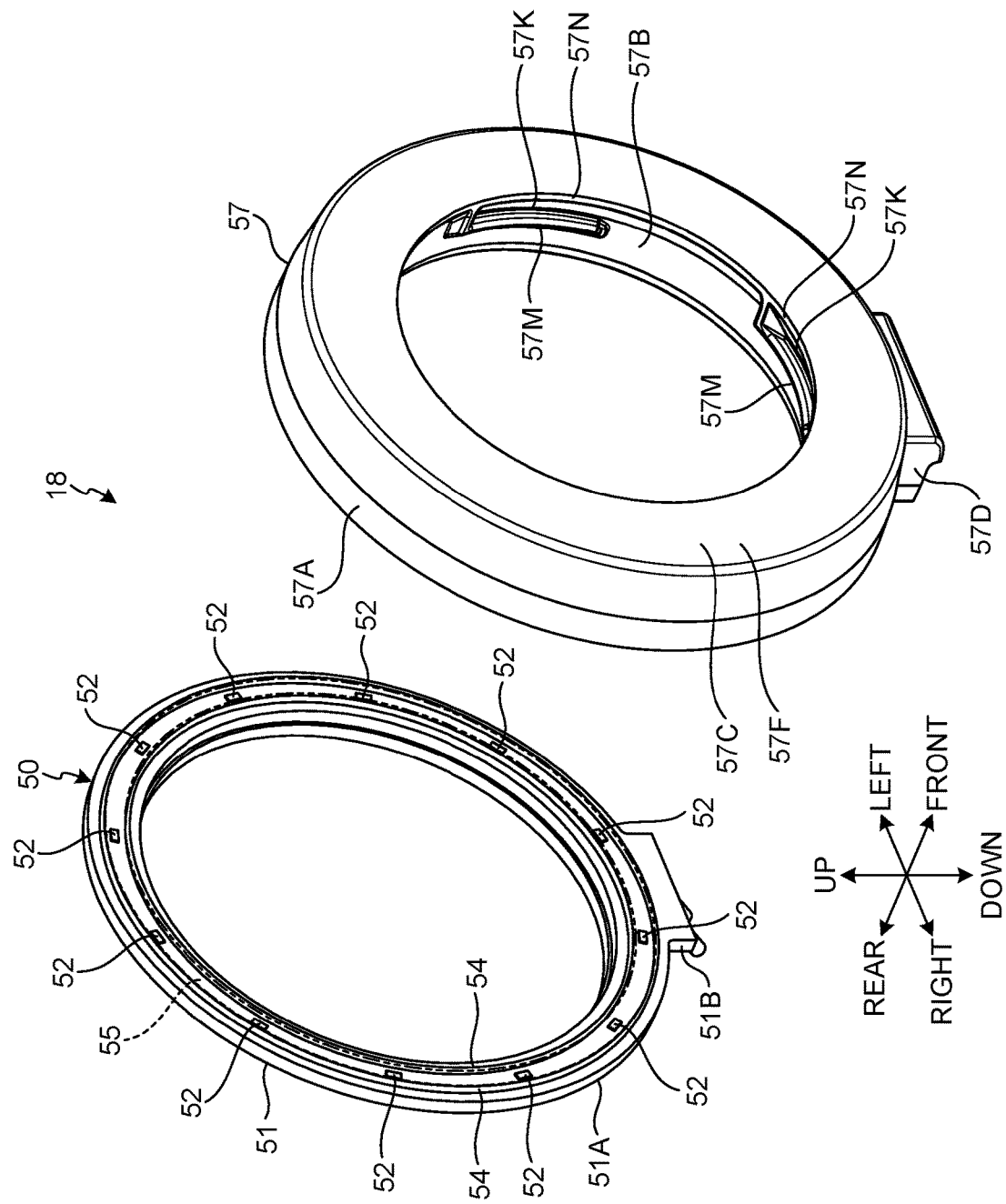
FIG. 8 is an exploded oblique view, viewed from the front, which illustrates the light unit according to the first embodiment.
Figure 9:
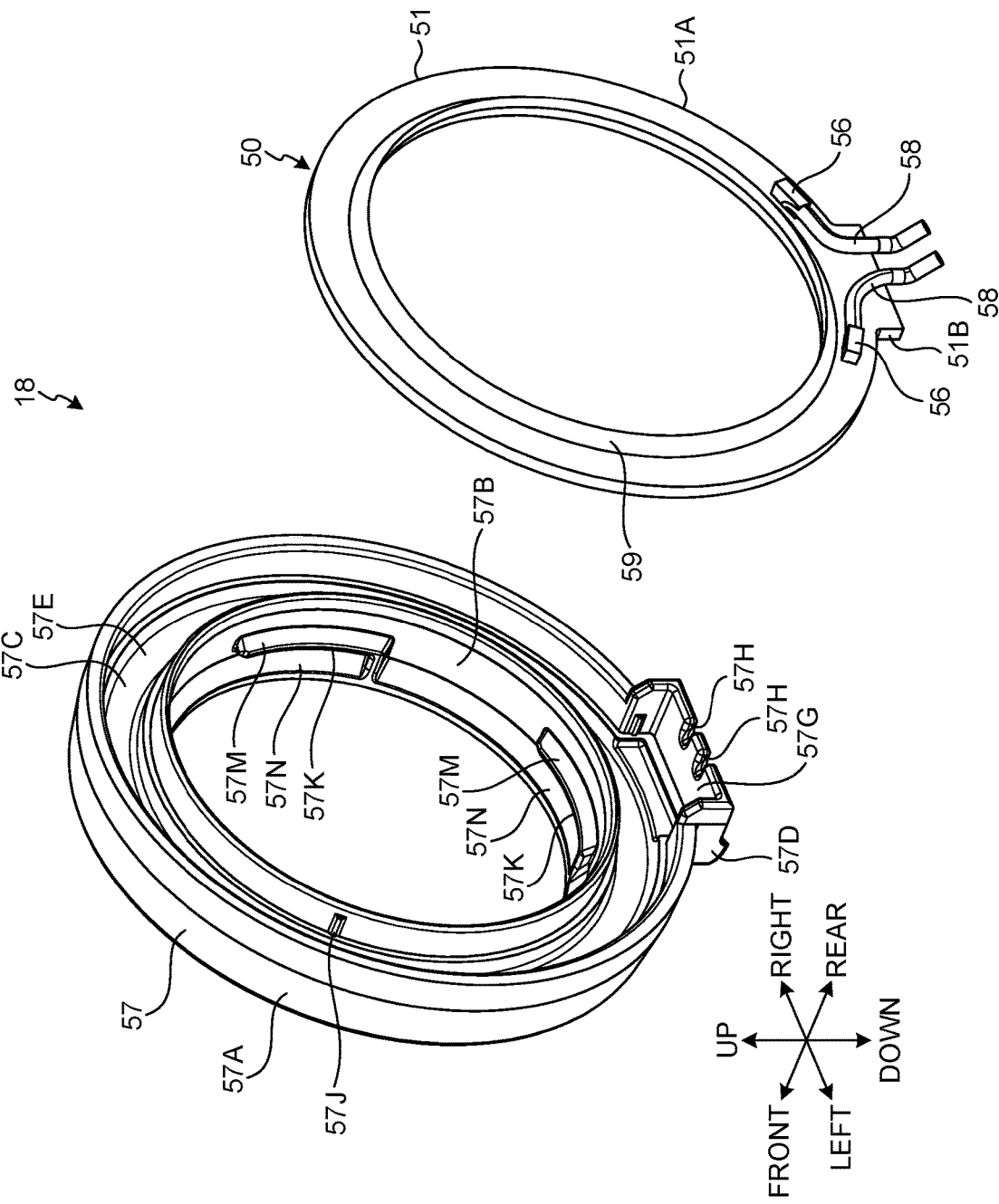
FIG. 9 is an exploded oblique view, viewed from the rear, which illustrates the light unit according to the first embodiment.

FIG. 6 is an oblique view, viewed from the front, which illustrates the light unit 18 according to the present embodiment. FIG. 7 is an oblique view, viewed from the rear, which illustrates the light unit 18 according to the present embodiment. FIG. 8 is an exploded oblique view, viewed from the front, which illustrates the light unit 18 according to the present embodiment. FIG. 9 is an exploded oblique view, viewed from the rear, which illustrates the light unit 18 according to the present embodiment.

As illustrated in FIGS. 6, 7, 8, and 9, the light unit 18 includes the chip-on-board light emitting diode 50 and a light cover 57. The chip-on-board light emitting diode 50 includes the substrate 51, the LED chips 52, the bank 54, the phosphor 55, and the pair of electrodes 56.

The substrate 51 has an annular shape. The substrate 51 includes a circular ring portion 51A and a support portion 51B protruding downward from a lower portion of the circular ring portion 51A.

The LED chips 52 are arranged on a front surface of the circular ring portion 51A of the substrate 51. The LED chips 52 are arranged at intervals in a circumferential direction of the circular ring portion 51A. In the present embodiment, twelve LED chips 52 are arranged at equal intervals in the circumferential direction of the circular ring portion 51A.

The bank 54 is provided on the front surface of the circular ring portion 51A of the substrate 51. The bank 54 protrudes forward from the front surface of the circular ring portion 51A. The bank 54 has a circular ring shape. In the present embodiment, the bank 54 is provided in a double circular ring shape as illustrated in FIG. 8. That is, in the present embodiment, the bank 54 includes a first bank 54 and a second bank 54 disposed radially outside with respect to the first bank 54. The first bank 54 is disposed radially inside with respect to the LED chips 52. The second bank 54 is disposed radially outside with respect to the LED chips 52.

The phosphor 55 is disposed on the front surface of the circular ring portion 51A of the substrate 51. The phosphor 55 has a circular ring shape. The phosphor 55 is disposed between the first bank 54 and the second bank 54. The phosphor 55 is disposed so as to cover the LED chips 52.

In the present embodiment, the electrodes 56 are disposed on the rear surface of the substrate 51. In the present embodiment, the electrodes 56 are disposed on the rear surface of the circular ring portion 51A. The electrodes 56 are connected to the controller 17 via a lead wires 58. Each of the lead wires 58 is connected to a corresponding one of the electrodes 56. A pair of the lead wires 58 is supported on a rear surface of the support portion 51B. The electrodes 56 may be disposed on a front surface of the support portion 51B, for example. The lead wires 58 may be supported on the front surface of the support portion 51B.

A current output from the battery pack 25 is supplied to the electrodes 56 via the controller 17 and the lead wires 58. The current supplied to the electrodes 56 is supplied to the LED chips 52 via the substrate 51 and the gold wires 53 (not illustrated in FIGS. 6 to 9). The LED chips 52 emit light based on the current supplied from the battery pack 25.

Figure 10:
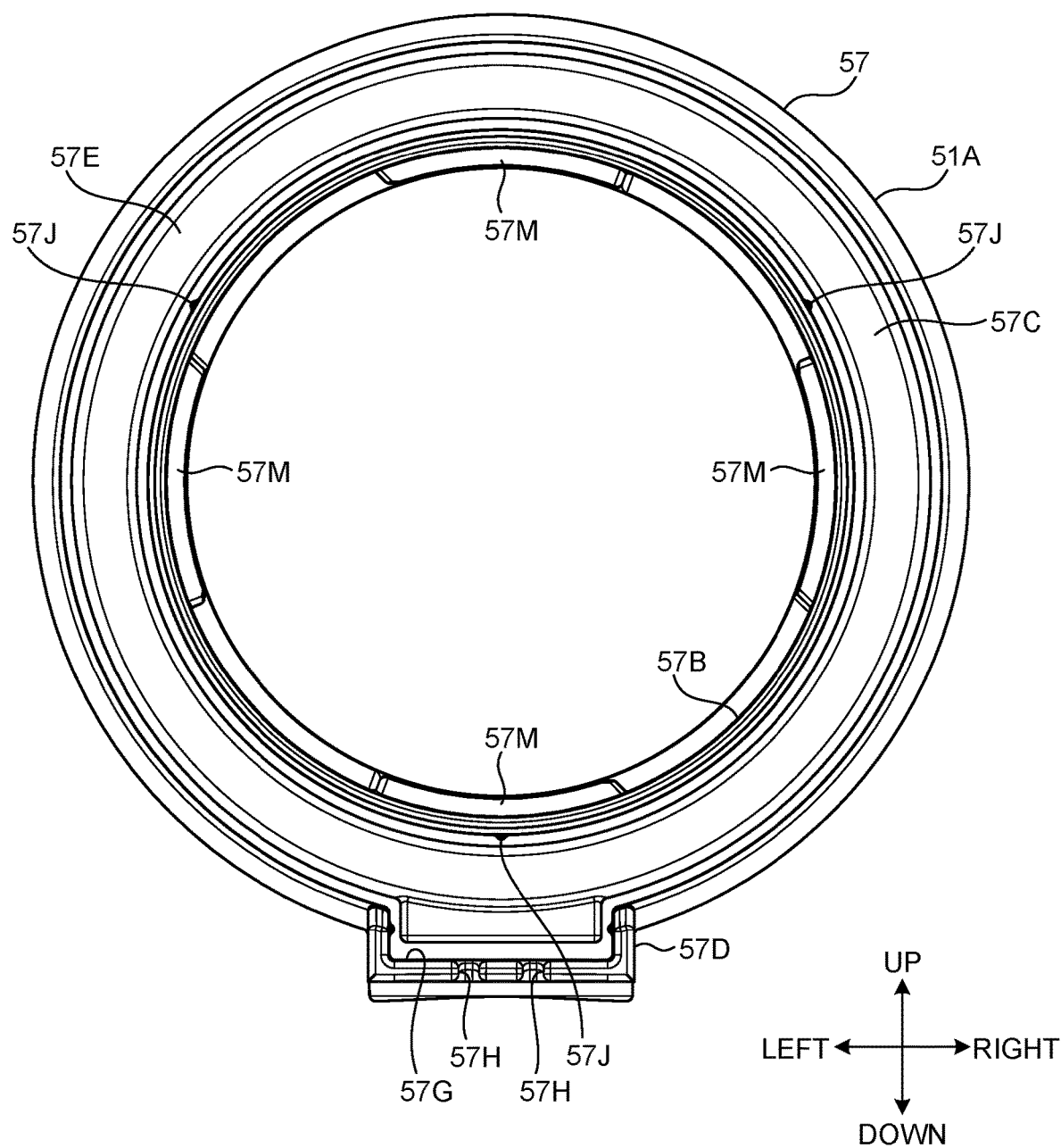
FIG. 10 is a rear view of a light cover according to the first embodiment.

FIG. 10 is a rear view of the light cover 57 according to the present embodiment. The light cover 57 is connected to the chip-on-board light emitting diode 50. The light cover 57 is fixed to the substrate 51. The light cover 57 is made of polycarbonate resin. At least a part of the light cover 57 is disposed in front of the chip-on-board light emitting diode 50. The light cover 57 includes an outer cylindrical portion 57A, an inner cylindrical portion 57B, a light transmission portion 57C, and a support portion 57D.

The outer cylindrical portion 57A is disposed more radially outward than the inner cylindrical portion 57B. In the radial direction, at least a part of the chip-on-board light emitting diode 50 is disposed between the outer cylindrical portion 57A and the inner cylindrical portion 57B. The outer cylindrical portion 57A is disposed more radially outward than the circular ring portion 51A of the substrate 51. The inner cylindrical portion 57B is disposed more radially inward than the circular ring portion 51A of the substrate 51.

The light transmission portion 57C has a circular ring shape. The light transmission portion 57C is disposed so as to connect a front end portion of the outer cylindrical portion 57A and a front end portion of the inner cylindrical portion 57B. The light transmission portion 57C faces the front surface of the circular ring portion 51A. The light transmission portion 57C faces the LED chips 52. The light emitted from the LED chips 52 passes through the light transmission portion 57C and is emitted forward from the light unit 18.

The light transmission portion 57C has an entrance surface 57E on which the light from the LED chips 52 is incident, and an exit surface 57F from which the light transmitted through the light transmission portion 57C is output. The entrance surface 57E faces the LED chips 52. The entrance surface 57E faces substantially rearward. The exit surface 57F faces substantially forward.

The support portion 57D is provided so as to protrude downward from a lower portion of the outer cylindrical portion 57A. A recess 57G is formed in the support portion 57D. The support portion 51B of the substrate 51 is disposed in the recess 57G. Two notches 57H are formed in the support portion 57D. The lead wires 58 are respectively disposed in the notches 57H.

Figure 11:
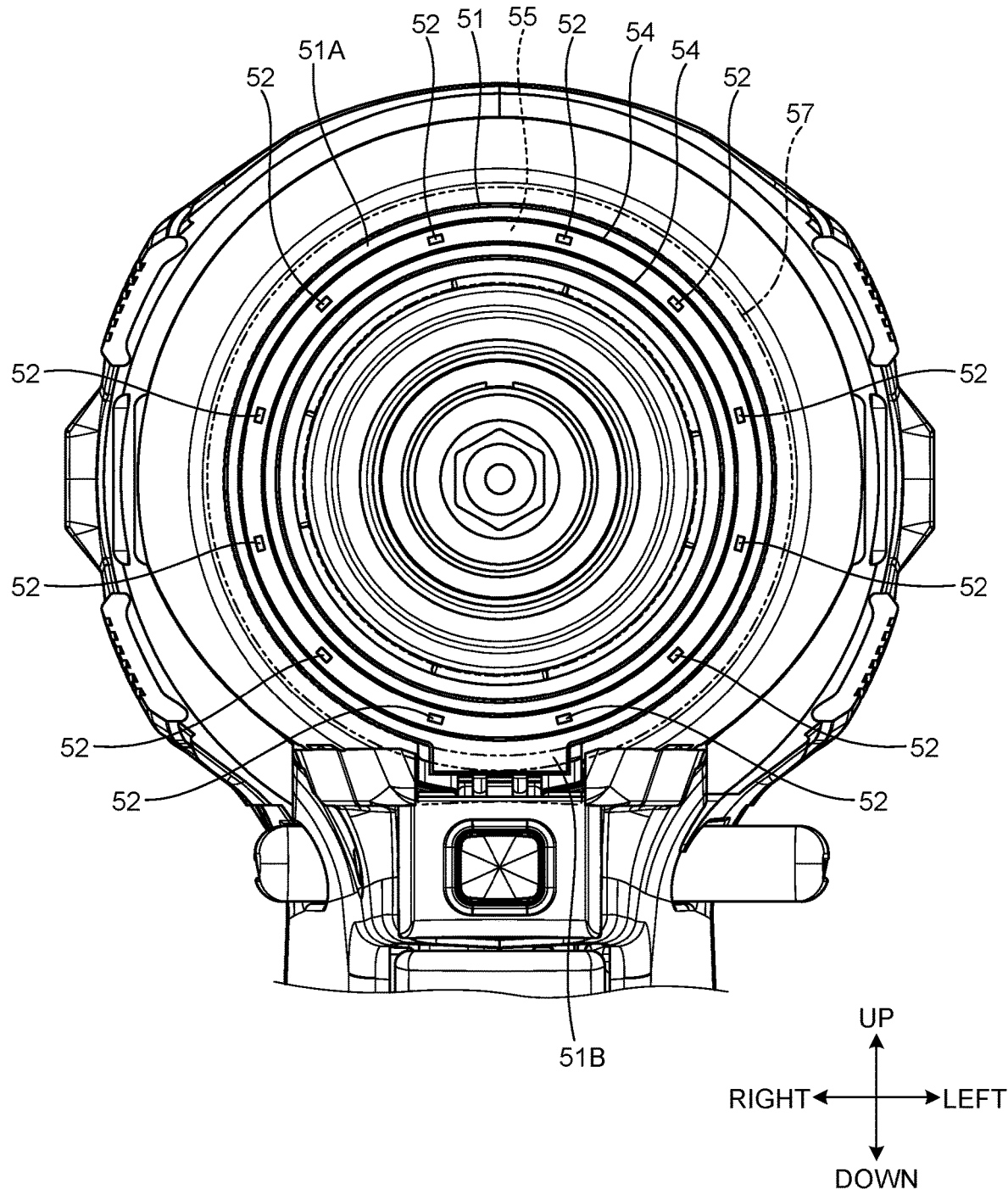
FIG. 11 is a front view of the upper portion of the power tool according to the first embodiment.
Figure 12:
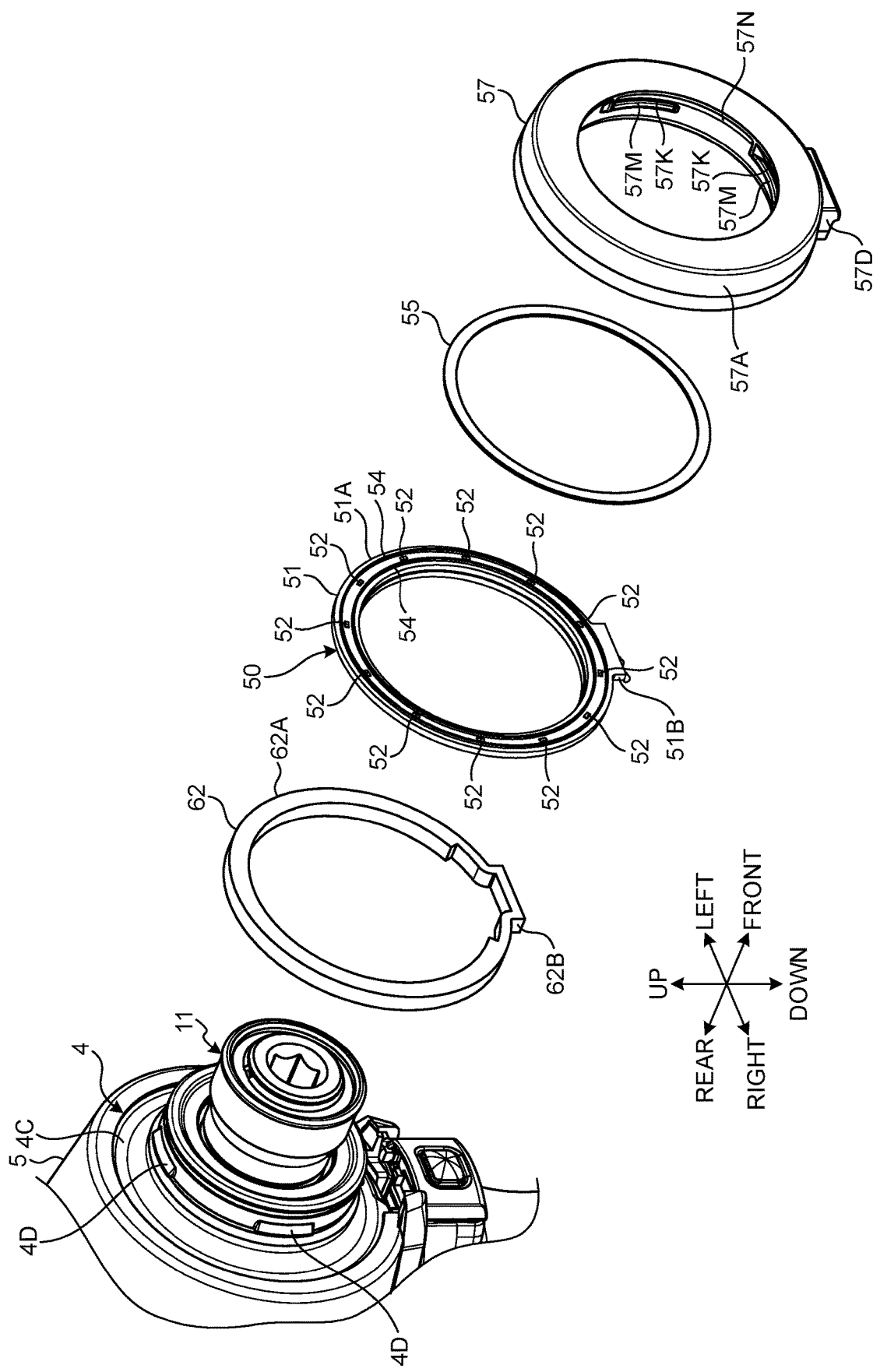
FIG. 12 is an exploded oblique view, viewed from the front, which illustrates the upper portion of the power tool according to the first embodiment.
Figure 13:
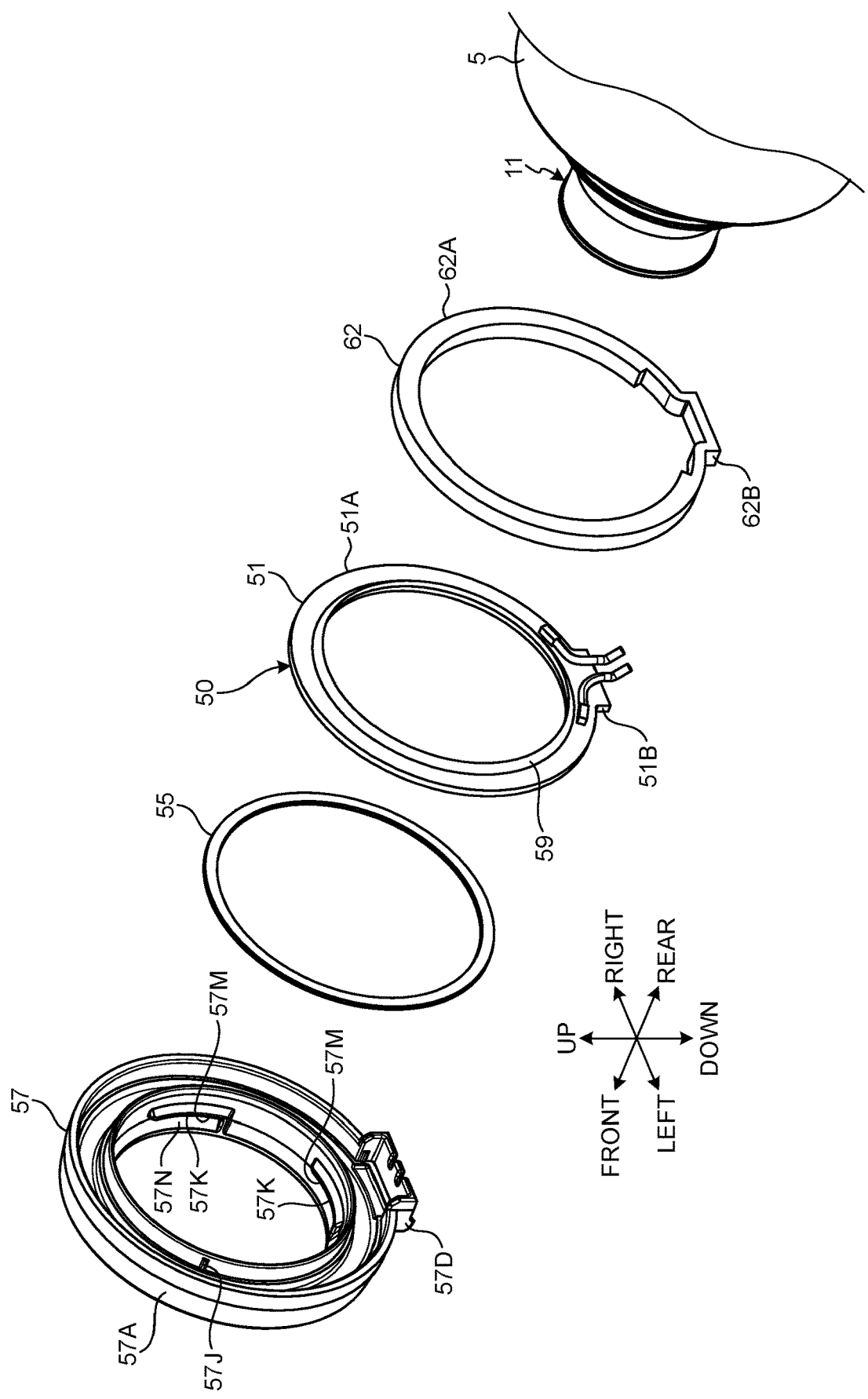
FIG. 13 is an exploded oblique view, viewed from the rear, which illustrates the upper portion of the power tool according to the first embodiment.
Figure 14:
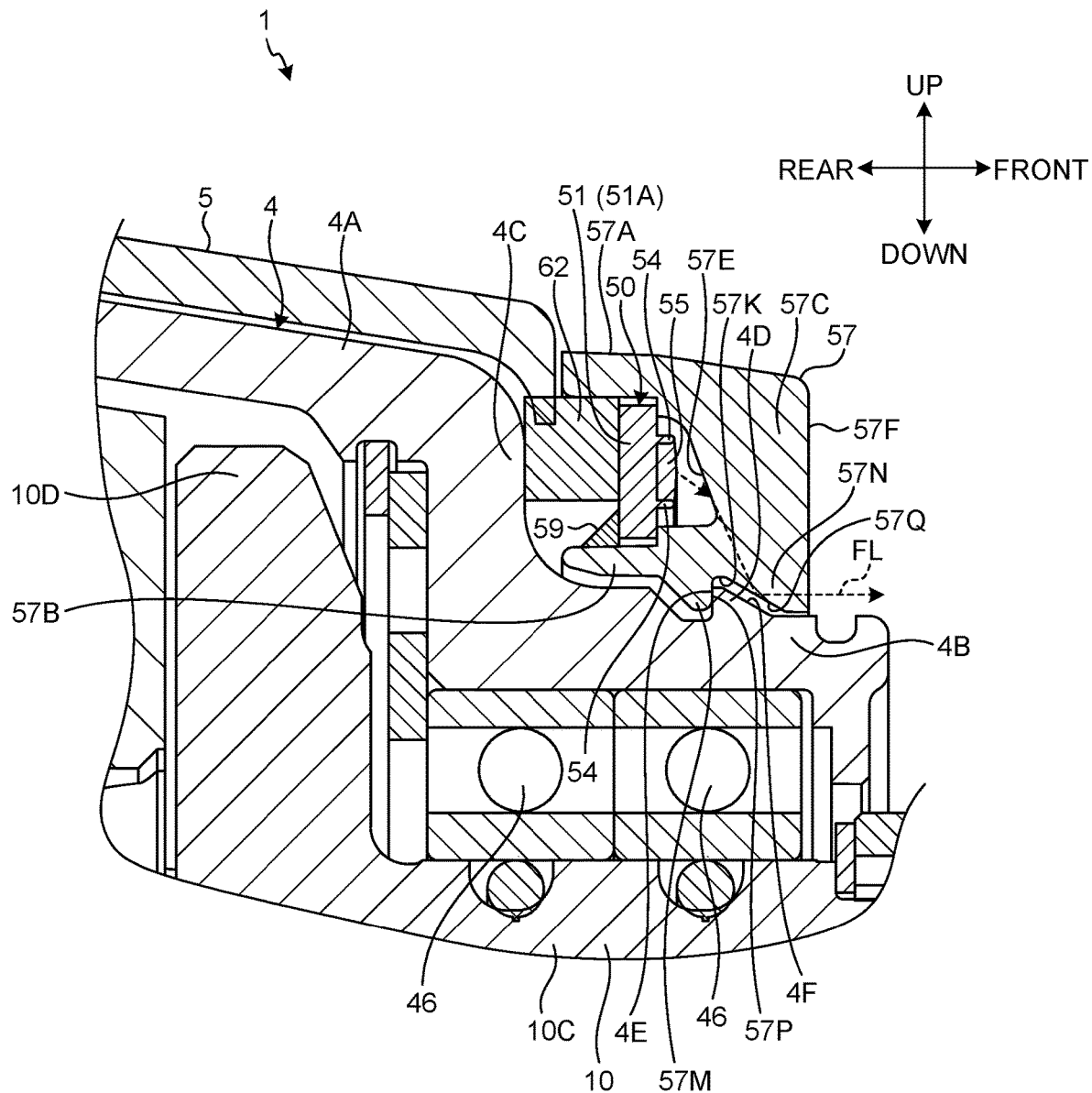
FIG. 14 is a cross-sectional view illustrating a part of the power tool according to the first embodiment.

FIG. 11 is a front view of the upper portion of the power tool 1 according to the present embodiment. FIG. 12 is an exploded oblique view, viewed from the front, which illustrates the upper portion of the power tool 1 according to the present embodiment. FIG. 13 is an exploded oblique view, viewed from the rear, which illustrates the upper portion of the power tool 1 according to the present embodiment. FIG. 14 is a cross-sectional view illustrating a part of the power tool 1 according to the present embodiment.

The light unit 18 including the chip-on-board light emitting diode 50 is disposed around the anvil shaft portion 10C of the anvil 10. The light unit 18 including the chip-on-board light emitting diode 50 is disposed around the front cylindrical portion 4B of the hammer case 4. The inner cylindrical portion 57B of the light cover 57 is disposed around the front cylindrical portion 4B of the hammer case 4. The inner cylindrical portion 57B of the light cover 57 is fixed to the front cylindrical portion 4B of the hammer case 4.

The substrate 51 is fixed to the light cover 57. In the radial direction, the substrate 51 is disposed between the outer cylindrical portion 57A and the inner cylindrical portion 57B. As illustrated in FIGS. 9 and 10, support protrusions 57J are provided on an outer circumferential surface of the inner cylindrical portion 57B. The support protrusions 57J protrude radially outward from the outer circumferential surface of the inner cylindrical portion 57B. The support protrusions 57J are provided at intervals in the circumferential direction. As illustrated in FIG. in the present embodiment, three support protrusions 57J are provided at intervals in the circumferential direction. An inner circumferential surface of the circular ring portion 51A of the substrate 51 is supported by the support protrusions 57J. The substrate 51 is fixed to the inner cylindrical portion 57B via an adhesive 59 (FIG. 7). In the present embodiment, the rear surface of the substrate 51 and the outer circumferential surface of the inner cylindrical portion 57B are fixed by the adhesive 59.

Protrusions 4D are provided on the outer circumferential surface of the front cylindrical portion 4B. The protrusions 4D protrude radially outward from the outer circumferential surface of the front cylindrical portion 4B. The protrusions 4D are provided at intervals in the circumferential direction. In the present embodiment, four protrusions 4D are provided at intervals in the circumferential direction. Each of the protrusions 4D has a rear surface 4E facing rearward and a slope 4F inclined radially inward toward the front.

The light cover 57 is fixed to the front cylindrical portion 4B of the hammer case 4. On an inner circumferential surface of the inner cylindrical portion 57B of the light cover 57, rear slide portions 57M and front slide portions 57N are provided. The rear slide portions 57M and the front slide portions 57N each protrude radially inward from the inner circumferential surface of the inner cylindrical portion 57B. The front slide portions 57N are disposed forward of the rear slide portions 57M. As illustrated in FIG. 10, four rear slide portions 57M are provided at intervals in the circumferential direction. The four front slide portions 57N are respectively disposed forward of the four rear slide portions 57M. Recesses 57K are provided between the rear slide portions 57M and the front slide portions 57N. The recesses 57K are provided in the inner cylindrical portion 57B. The protrusions 4D are respectively disposed in the recesses 57K. The rear slide portions 57M each have a front surface 57P, which is in contact with the rear surface 4E of each of the protrusions 4D. The front slide portions 57N each have a slope 57Q, which faces the slope 4F of each of the protrusions 4D.

An insertion port is provided between one end of each of the rear slide portions 57M in the circumferential direction and the corresponding one of the front slide portions 57N. The protrusions 4D are disposed in the recesses 57K via the insertion ports. After the protrusions 4D are inserted into the insertion ports, the light unit 18 is rotated, whereby the protrusions 4D are inserted into the recesses 57K. As a result, the light cover 57 and the front cylindrical portion 4B of the hammer case 4 are fixed. The light unit 18 and the hammer case 4 are fixed by fixing the light cover 57 and the front cylindrical portion 4B of the hammer case 4.

The light emitted from the LED chips 52 is incident on the entrance surface 57E via the phosphor 55. As illustrated in FIG. 14, the entrance surface 57E is inclined forward toward the radial inside. The light incident on the entrance surface 57E passes through the light transmission portion 57C and then is output through the exit surface 57F.

As indicated by an arrow FL in FIG. 14, at least a part of the light incident on the entrance surface 57E reaches the slopes 57Q. Each of the slopes 57Q is inclined forward toward the radial inside. The light that has reached each of the slopes 57Q is totally reflected by the slope 57Q and travels forward. The light totally reflected by the slopes 57Q is output through the exit surface 57F.

In the present embodiment, the impact tool 1 includes a suppression device that suppresses the temperature of the chip-on-board light emitting diode 50 to a predetermined allowable value or less. The suppression device includes a heat insulating material 62 disposed on at least a part of the periphery of the chip-on-board light emitting diode 50. The heat insulating material 62 is disposed between a heating source disposed on at least a part of the periphery of the chip-on-board light emitting diode 50 and the chip-on-board light emitting diode 50. In the present embodiment, the heating source includes the hammer case 4. The speed reduction mechanism 7 and the impact mechanism 9 are driven inside the hammer case 4. A temperature of the hammer case 4 is increased by driving of the speed reduction mechanism 7 and the impact mechanism 9. The hammer case 4 whose temperature has risen serves as a heating source for the impact tool 1.

The heat insulating material 62 is disposed between the hammer case 4 and the light unit 18. The heat insulating material 62 is in contact with the substrate 51 of the chip-on-board light emitting diode 50. In the present embodiment, the heat insulating material 62 is in contact with each of the substrate 51 of the chip-on-board light emitting diode 50 and the hammer case 4.

In the present embodiment, the heat insulating material 62 is disposed between the rear surface of the substrate 51 and the front surface of the annular portion 4C. The heat insulating material 62 is in contact with each of the rear surface of the substrate 51 and the front surface of the annular portion 4C. Heat conductivity of the heat insulating material 62 is lower than heat conductivity of air. Heat conductivity of the heat insulating material 62 is lower than heat conductivity of the substrate 51. Heat conductivity of the heat insulating material 62 is lower than heat conductivity of the light cover 57. The heat insulating material 62 is an electrically insulating material.

The heat insulating material 62 may be a coating film applied to one or both of the substrate 51 and the hammer case 4, or may have a solid sheet shape. In the present embodiment, the heat insulating material 62 is a solid sheet-like member. In the following description, the heat insulating material 62 is appropriately referred to as a heat insulating sheet 62.

The heat insulating sheet 62 has an annular shape. The heat insulating sheet 62 includes a circular ring portion 62A that is in contact with the rear surface of the circular ring portion 51A of the substrate 51 and a protrusion 62B that is in contact with the rear surface of the support portion 51B of the substrate 51. The protrusion 62B protrudes downward from a lower portion of the circular ring portion 62A.

In the present embodiment, at least a part of the heat insulating sheet 62 is also disposed between the chip-on-board light emitting diode 50 and the case cover 5.

When the trigger lever 14 is operated, the motor 6 is activated (energized), and light is emitted from the LED chips 52 of the chip-on-board light emitting diode 50. The chip-on-board light emitting diode 5 emits (outputs) a higher amount of light, thereby brightly illuminating the work target or work space.

On the other hand, the chip-on-board light emitting diode 50 generates a higher amount of heat, the temperature of the chip-on-board light emitting diode 50 may rise excessively. When the temperature of the chip-on-board light emitting diode 50 exceeds an allowable value, the LED chips 52 may deteriorate and the life of the chip-on-board light emitting diode 50 may be shortened. The allowable value of the temperature of the chip-on-board light emitting diode 50 is, for example, a heat resistant temperature of the LED chips 52.

The heat insulating sheet 62 is disposed such that heat of the hammer case 4 as a heating source is not transmitted to the chip-on-board light emitting diode 50. As a result, an excessive rise in temperature of the chip-on-board light emitting diode 50 is suppressed.

In the present embodiment, the heat insulating sheet 62 may be spaced away from one or both of the hammer case 4 and the case cover 5.

In the present embodiment, a drive voltage of the light unit 18 is 5 V. The light flux of the light unit 18 is 80 lumens or more and 200 lumens or less. The light flux of the light unit 18 may be 100 lumens or more and 150 lumens or less, or may be 120 lumens or more and 140 lumens or less.

Effects

As described above, in the present embodiment, the impact tool 1 may include the motor 6, the anvil 10 that is rotated by the rotational force of the motor 6, the chip-on-board light emitting diode 50 disposed around the anvil 10, and the suppression device that suppresses the temperature of the chip-on-board light emitting diode 50 to a predetermined allowable value or less.

According to the above configuration, since the temperature of the chip-on-board light emitting diode 50 is suppressed to the predetermined allowable value or less by the suppression device, an excessive rise in temperature of the chip-on-board light emitting diode 50 is suppressed. The predetermined allowable value of the temperature of the chip-on-board light emitting diode 50 may be the heat-resistant temperature of the LED chip 52 of the chip-on-board light emitting diode 50.

In the present embodiment, the suppression device may include the heat insulating material 62 disposed on at least a part of the periphery of the chip-on-board light emitting diode 50.

According to the above configuration, the heat insulating material 62 suppresses an excessive rise in temperature of the chip-on-board light emitting diode 50, and suppresses the temperature of the chip-on-board light emitting diode 50 to the predetermined allowable value or less. For example, in a case where a heating source is present at least at a part of the periphery of the chip-on-board light emitting diode 50, the heat insulating material 62 is disposed between the heating source and the chip-on-board light emitting diode 50, whereby the chip-on-board light emitting diode 50 is prevented from being heated by the heating source. As a result, the temperature of the chip-on-board light emitting diode 50 is suppressed to the allowable value or less.

In the present embodiment, the heat insulating material 62 may contact the substrate 51 of the chip-on-board light emitting diode 50.

According to the above configuration, the heat insulating material 62 suppresses an excessive rise in temperature of the chip-on-board light emitting diode 50.

In the present embodiment, the heating source may be provided in the impact tool 1. The heat insulating material 62 may be disposed between the heating source and the chip-on-board light emitting diode 50.

According to the above configuration, since the heat insulating material 62 prevents the chip-on-board light emitting diode 50 from being heated by the heating source, an excessive rise in temperature of the chip-on-board light emitting diode 50 is suppressed.

In the present embodiment, the impact tool 1 may include the speed reduction mechanism 7 configured to transmit the rotational force of the motor 6 to the anvil 10, and the hammer case 4 that accommodates therein the speed reduction mechanism 7. The heating source may include the hammer case 4.

According to the above configuration, heating of the chip-on-board light emitting diode 50 is suppressed by the hammer case 4.

In the present embodiment, the heat insulating material 62 may be in contact with each of the substrate 51 of the chip-on-board light emitting diode 50 and the hammer case 4.

According to the above configuration, heating of the chip-on-board light emitting diode 50 is suppressed by the hammer case 4.

In the present embodiment, the heat insulating material 62 may have a sheet shape.

According to the above configuration, in a case where the heat insulating material 62 is the solid heat insulating sheet 62, the heat insulating sheet 62 can be sandwiched between the substrate 51 of the chip-on-board light emitting diode 50 and the hammer case 4.

In the present embodiment, the hammer case 4 may include: the rear cylindrical portion 4A that accommodates the speed reduction mechanism 7; the front cylindrical portion 4B that holds the anvil bearing 46 supporting the anvil 10; and the annular portion 4C that connects the front end portion of the rear cylindrical portion 4A and the rear end portion of the front cylindrical portion 4B. The chip-on-board light emitting diode 50 may be disposed around the front cylindrical portion 4B. The heat insulating material 62 may be disposed between the substrate 51 and the annular portion 4C.

According to the above configuration, an increase in size of the impact tool 1 is suppressed, and an excessive rise in temperature of the chip-on-board light emitting diode 50 is suppressed.

In the present embodiment, the impact tool 1 may include the case cover 5 that covers the surface of the rear cylindrical portion 4A. At least a part of the heat insulating material 62 may be disposed between the chip-on-board light emitting diode 50 and the case cover 5.

According to the above configuration, an excessive rise in temperature of the chip-on-board light emitting diode 50 is suppressed.

In the present embodiment, the substrate 51 may have the circular ring portion 51A, and the LED chip 52 may be disposed on the front surface of the circular ring portion 51A. The impact tool 1 may further include the light cover 57 that includes: the outer cylindrical portion 57A disposed radially outside with respect to the circular ring portion 51A; the inner cylindrical portion 57B disposed radially inside with respect to the circular ring portion 51A; and the light transmission portion 57C disposed so as to connect the front end portion of the outer cylindrical portion 57A and the front end portion of the inner cylindrical portion 57B and through which light emitted from the LED chip 52 of the chip-on-board light emitting diode 50 passes.

According to the above configuration, the chip-on-board light emitting diode 50 can illuminate a work target.

In the present embodiment, the inner cylindrical portion 57B may be disposed around the front cylindrical portion 4B and fixed to the front cylindrical portion 4B.

According to the above configuration, the chip-on-board light emitting diode 50 is fixed to the front cylindrical portion 4B of the hammer case 4 via the light cover 57.

In the present embodiment, the front cylindrical portion 4B may have the protrusion 4D protruding radially outward from the outer circumferential surface of the front cylindrical portion 4B, and the inner cylindrical portion 57B may have the recess 57K in which the protrusion 4D is disposed.

According to the above configuration, the chip-on-board light emitting diode 50 is fixed to the front cylindrical portion 4B of the hammer case 4 via the light cover 57.

Second Embodiment

A second embodiment will be described. In the following description, the same or equivalent components as those of the above-described embodiment are denoted by the same reference signs, and the description of the components is simplified or omitted.

Floodlight

Figure 15:
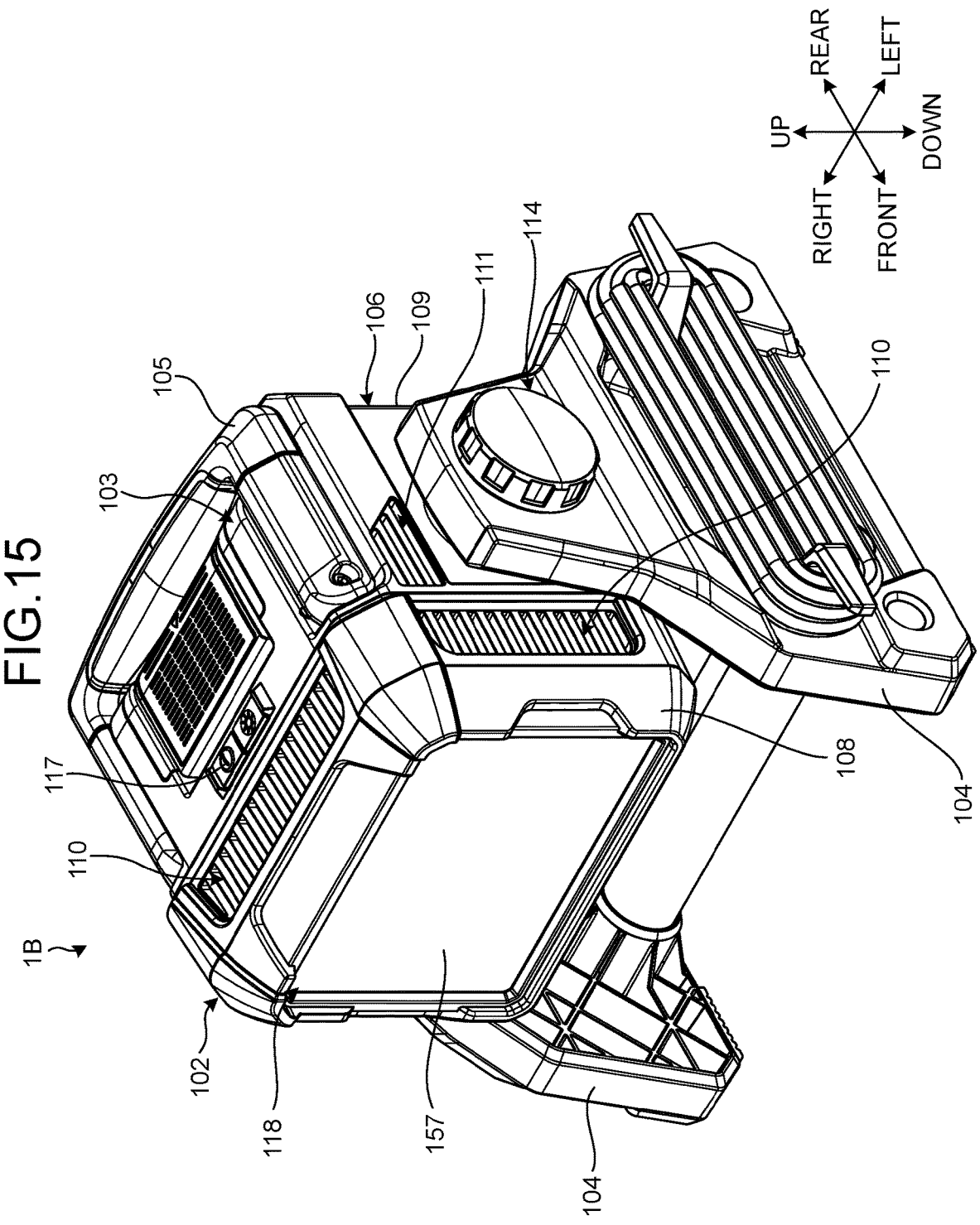
FIG. 15 is an oblique view, viewed from the front, which illustrates a floodlight according to a second embodiment.
Figure 16:
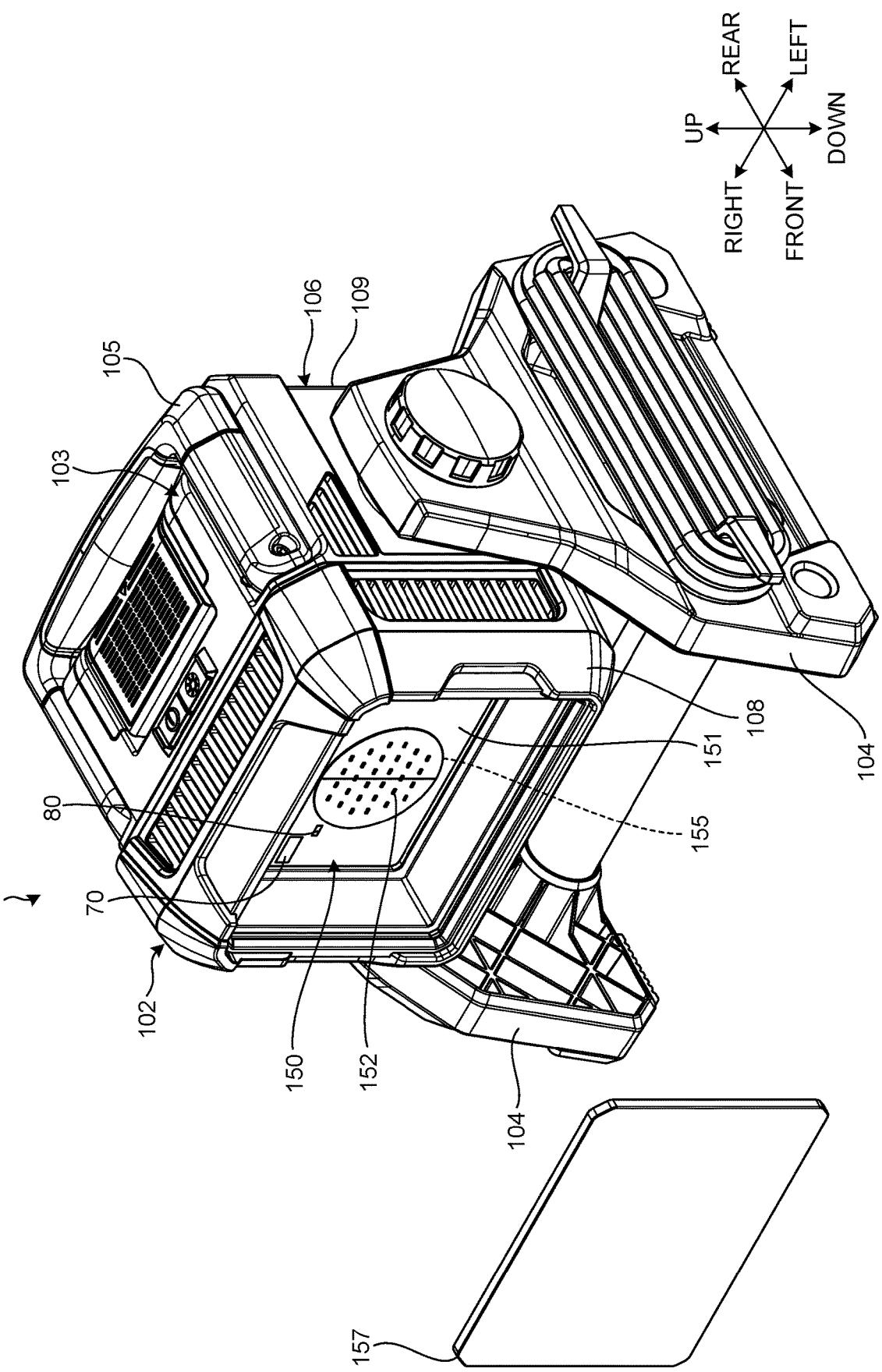
FIG. 16 is an exploded oblique view, viewed from the front, which illustrates the floodlight of the second embodiment.
Figure 17:
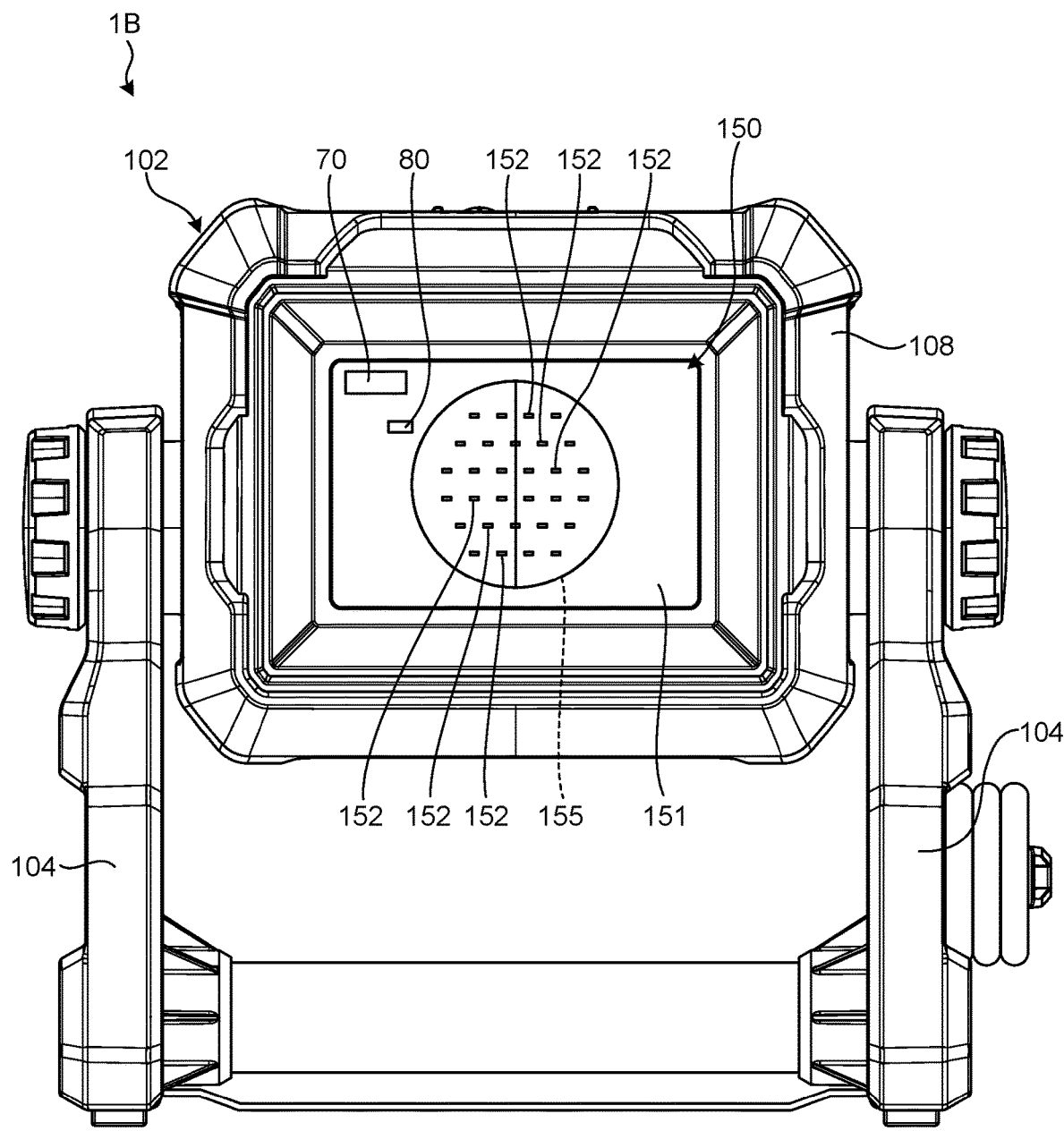
FIG. 17 is a front view illustrating a part of the floodlight according to the second embodiment.

FIG. 15 is an oblique view, viewed from the front, which illustrates a floodlight 1B according to the present embodiment. FIG. 16 is an exploded oblique view, viewed from the front, which illustrates the floodlight 1B according to the present embodiment. FIG. 17 is a front view illustrating a part of the floodlight 1B according to the present embodiment.

The floodlight 1B includes a main body 102, a cover 103 connected to the main body 102, legs 104 connected to the main body 102, and a handle 105 connected to the main body 102.

The main body 102 includes a housing 106 and a light unit 118.

The housing 106 includes a front housing 108 and a rear housing 109. The front housing 108 is disposed forward of the rear housing 109.

The front housing 108 has a rectangular frame shape. The front housing 108 is disposed around the light unit 118. The front housing 108 accommodates therein at least a part of the light unit 118. A vent 110 is provided in each of an upper portion, a lower portion, a left portion, and a right portion of the front housing 108. The vents 110 each connect an internal space and an external space of the housing 106.

The rear housing 109 is connected to a rear end portion of the front housing 108. The rear housing 109 includes an upper plate, a lower plate, a left plate, a right plate, and a rear plate. A vent 111 is provided in each of the lower plate, the left plate, and the right plate. Each of the vents 111 connects the internal space and the external space of the housing 106.

The light unit 118 emits light forward. The light unit 118 is an output unit of the floodlight 1B that outputs light. The light unit 118 is disposed at a front portion of the main body 102. The light unit 118 includes a chip-on-board light emitting diode 150 and a light cover 157. The chip-on-board light emitting diode 150 includes a substrate 151, a plurality of LED chips 152 mounted on the substrate 151, and a phosphor 155 covering the LED chips 152. The light cover 157 is a light transmitting member having a plate shape.

In the present embodiment, the LED chips 152 are arranged in a matrix on the front surface of the substrate 151. In the present embodiment, thirty LED chips 152 are arranged. A ring-shaped bank (not illustrated in FIGS. 16 and 17) is provided so as to surround the thirty LED chips 152. The phosphor 155 is disposed on the inner side of the ring-shaped bank so as to cover the thirty LED chips 152.

The cover 103 forms a battery housing space with the main body 102. The cover 103 is connected to a rear portion of the main body 102. In the present embodiment, the rear portion of the main body 102 is a rear portion of the rear housing 109. A battery mounting unit is provided in the battery housing space. A battery pack is mounted on the battery mounting unit. The rated voltage of the battery pack is 18 V. In the United States and some other countries, it may be described as 20 V Max.

The legs 104 are coupled to the rear housing 109 via coupling mechanisms 114.

The handle 105 is held by a user of the floodlight 1B. The handle 105 is connected to the rear housing 109 via a hinge mechanism. The handle 105 is rotated to be disposed at a storage position and a use position.

The floodlight 1B includes a power button 117. The power button 117 is disposed at a front portion of an upper portion of the rear housing 109. When the power button 117 is operated (pressed), the floodlight 1B is activated.

In the present embodiment, the light unit 118 includes a microcomputer 70 and a temperature sensor 80. The microcomputer 70 and the temperature sensor 80 are arranged on the substrate 151 of the chip-on-board light emitting diode 150. Each of the microcomputer 70 and temperature sensor 80 is disposed at least at a part of the periphery of the phosphor 155. The temperature sensor 80 detects the temperature of the chip-on-board light emitting diode 150. In the present embodiment, the temperature sensor 80 detects the temperature of the substrate 151.

In a case where the substrate 151 of the chip-on-board light emitting diode 150 is mounted on a predetermined circuit board, one or both of the microcomputer 70 and the temperature sensor 80 may be disposed on the circuit board.

Figure 18:
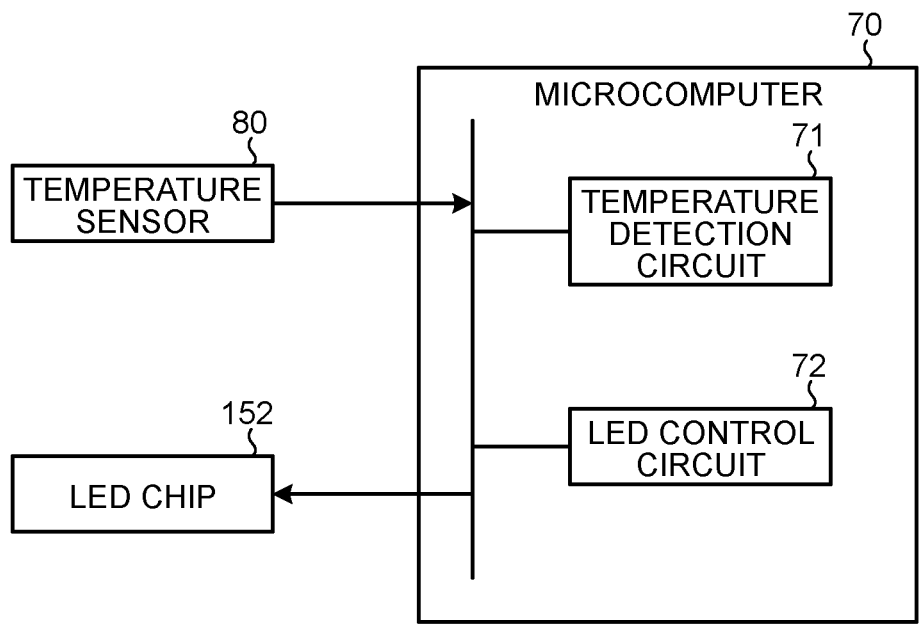
FIG. 18 is a block diagram illustrating a light unit according to the second embodiment.

FIG. 18 is a block diagram illustrating the light unit 118 according to the present embodiment. As illustrated in FIG. 18, the microcomputer 70 includes a temperature detection circuit 71 and an LED control circuit 72. The temperature detection circuit 71 acquires detection data of the temperature sensor 80. The LED control circuit 72 controls a light emission state of the LED chips 152 of the chip-on-board light emitting diode 150 such that the temperature of the chip-on-board light emitting diode 150 is equal to or less than a predetermined allowable value. The predetermined allowable value of the temperature of the chip-on-board light emitting diode 150 is set to be, for example, the heat-resistant temperature of the LED chips 152 of the chip-on-board light emitting diode 150.

In the present embodiment, when the LED control circuit 72 determines that the temperature of the chip-on-board light emitting diode 150 exceeds the allowable value based on the detection data of the temperature sensor 80 acquired by the temperature detection circuit 71, the LED control circuit 72 reduces the amount of light emitted from the LED chips 152. That is, when determining that the temperature of the chip-on-board light emitting diode 150 exceeds the allowable value in a state where all of the thirty LED chips 152 are turned on (emit light) with the first light amount, the LED control circuit 72 causes all of the thirty LED chips 152 to emit light with the second light amount lower than the first light amount.

Alternatively, when determining that the temperature of the chip-on-board light emitting diode 150 exceeds the allowable value based on the detection data of the temperature sensor 80 acquired by the temperature detection circuit 71, the LED control circuit 72 may stop light emission of some of the thirty LED chips 152. That is, when determining that the temperature of the chip-on-board light emitting diode 150 exceeds the allowable value in a state where all of the thirty LED chips 152 are turned on, the LED control circuit 72 may continue turning on some LED chips 152 (for example, 20) and turn off the remaining some LED chips 152 (for example, 10). The light flux of the chip-on-board light emitting diode 150 is 1000 lumens or more and 8000 lumens or less. The light flux of the chip-on-board light emitting diode 150 may be 2000 lumens or more and 6000 lumens or less, or may be 3000 lumens or more and 5000 lumens or less.

Effects

As described above, in the present embodiment, the light unit 118 may include the chip-on-board light emitting diode 150 and the LED control circuit 72 configured to control the light emission state of the LED chips 152 of the chip-on-board light emitting diode 150 such that the temperature of the chip-on-board light emitting diode 150 is equal to or less than the predetermined allowable value.

According to the above configuration, since the temperature of the chip-on-board light emitting diode 150 is suppressed to the allowable value or less by the LED control circuit 72, an excessive rise in temperature of the chip-on-board light emitting diode 150 is suppressed. The predetermined allowable value of the temperature of the chip-on-board light emitting diode 150 may be the heat resistant temperature of the LED chips 152 of the chip-on-board light emitting diode 150.

In the present embodiment, the light unit 118 may include the temperature sensor 80 that detects the temperature of the chip-on-board light emitting diode 150. When the LED control circuit 72 determines that the temperature of the chip-on-board light emitting diode 150 exceeds the allowable value based on the detection data of the temperature sensor 80, the LED control circuit 72 may reduce the amount of light emitted from the LED chips 152.

According to the above configuration, when it is determined based on the detection data of the temperature sensor 80 that the temperature of the chip-on-board light emitting diode 150 exceeds the allowable value, the amount of light emitted from the LED chip 152 is reduced, whereby the temperature of the chip-on-board light emitting diode 150 is suppressed to equal to or less than the allowable value.

In the present embodiment, the temperature sensor 80 may be disposed on the substrate 151 of the chip-on-board light emitting diode 150 or on a circuit board on which the substrate 151 is mounted.

According to the above configuration, the temperature sensor 80 can detect the temperature of the chip-on-board light emitting diode 150.

In the present embodiment, the microcomputer 70 including the LED control circuit 72 may be disposed on the substrate 151 of the chip-on-board light emitting diode 150 or on a circuit board on which the substrate 151 is mounted.

According to the above configuration, an increase in size of the light unit 118 is suppressed.

Modification

The microcomputer 70 and the temperature sensor 80 according to the present embodiment may be mounted on the light unit 18 provided in the power tool 1 described in the first embodiment. That is, the light unit 18 provided in the power tool 1 may include the chip-on-board light emitting diode 50 and the LED control circuit 72 configured to control the light emission state of the LED chips 52 of the chip-on-board light emitting diode 50 such that the temperature of the chip-on-board light emitting diode 50 is equal to or less the predetermined allowable value. The light unit 18 provided in the power tool 1 may include the temperature sensor 80 that detects the temperature of the chip-on-board light emitting diode 50, and the LED control circuit 72 may reduce the amount of light emitted from the LED chips 52 when determining that the temperature of the chip-on-board light emitting diode 50 exceeds the allowable value based on the detection data of the temperature sensor The temperature sensor 80 may be disposed on the substrate 51 of the chip-on-board light emitting diode 50 or on a circuit board on which the substrate 51 is mounted.

Third Embodiment

A third embodiment will be described. In the following description, the same or equivalent components as those of the above-described embodiment are denoted by the same reference signs, and the description of the components is simplified or omitted.

Floodlight

Figure 19:
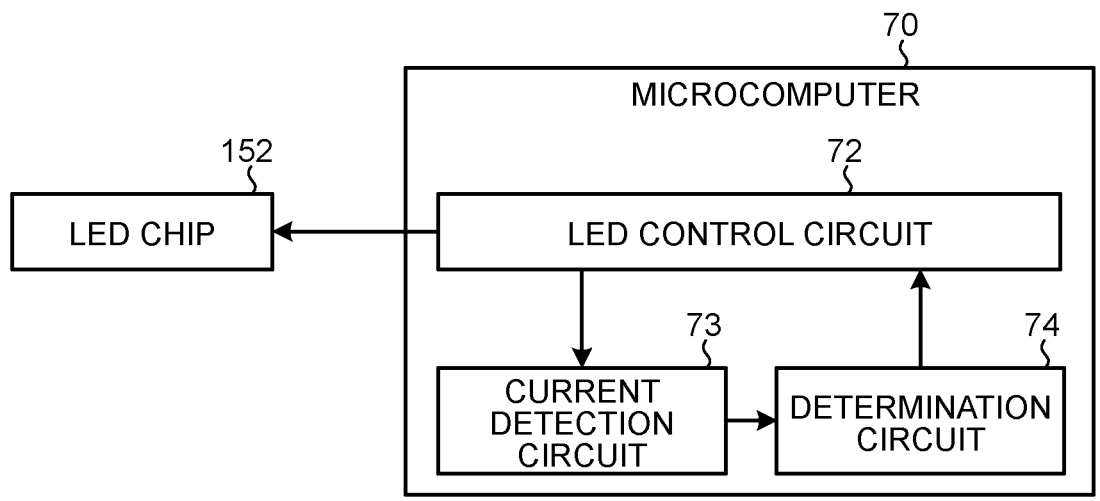
FIG. 19 is a block diagram illustrating a light unit according to a third embodiment.

FIG. 19 is a block diagram illustrating a light unit 118 according to the present embodiment. As illustrated in FIG. 19, a microcomputer 70 includes an LED control circuit 72, a current detection circuit 73, and a determination circuit 74.

The LED control circuit 72 controls a light emission state of the LED chips 152 of the chip-on-board light emitting diode 150 such that the temperature of the chip-on-board light emitting diode 150 is equal to or larger than a predetermined allowable value.

The current detection circuit 73 detects a current supplied from the LED control circuit 72 to the LED chip 152. The determination circuit 74 determines whether the temperature of the chip-on-board light emitting diode 150 exceeds a predetermined allowable value based on detection data of the current detection circuit 73. In the present embodiment, the determination circuit 74 estimates the temperature of the chip-on-board light emitting diode 150 based on a time integrated value of the current supplied from the LED control circuit 72 to the LED chip 152, and determines whether the estimated temperature of the chip-on-board light emitting diode 150 exceeds a predetermined allowable value.

When the determination circuit 74 determines that the temperature of the chip-on-board light emitting diode 150 exceeds the allowable value, the LED control circuit 72 reduces the amount of light emitted from the LED chip 152. That is, when it is determined that the temperature of the chip-on-board light emitting diode 150 exceeds the allowable value in a state where all of the thirty LED chips 152 are turned on (emit light) with the first light amount, the LED control circuit 72 causes all of the thirty LED chips 152 to emit light with the second light amount lower than the first light amount.

Alternatively, when it is determined that the temperature of the chip-on-board light emitting diode 150 exceeds the allowable value in a state where all of the thirty LED chips 152 are turned on, the LED control circuit 72 may continue turning on some LED chips 152 (for example, twenty LED chips) and turn off the remaining some LED chips 152 (for example, ten LED chips).

Effects

As described above, in the present embodiment, the light unit 118 may include the current detection circuit 73 that detects the current supplied to the LED chips 152, and the determination circuit 74 that determines whether the temperature of the chip-on-board light emitting diode 150 exceeds the predetermined allowable value based on the detection data of the current detection circuit 73. When it is determined that the temperature of the chip-on-board light emitting diode 150 exceeds the allowable value, the LED control circuit 72 may reduce the amount of light emitted from the LED chips 152.

According to the above configuration, the determination circuit 74 estimates the temperature of the chip-on-board light emitting diode 150 based on, for example, the time integral value of the current supplied to the LED chips 152. When it is determined that the estimated temperature of the chip-on-board light emitting diode 150 exceeds the allowable value, the amount of light emitted from the LED chips 152 is reduced, whereby the temperature of the chip-on-board light emitting diode 150 is suppressed to the allowable value or less.

Modification

The microcomputer 70 according to the present embodiment may be mounted on the light unit 18 provided in the power tool 1 described in the first embodiment. That is, the light unit 18 provided in the power tool 1 may include the chip-on-board light emitting diode 50 and the LED control circuit 72 configured to control the light emission state of the LED chips 52 of the chip-on-board light emitting diode 50 such that the temperature of the chip-on-board light emitting diode 50 is equal to or less than the predetermined allowable value. The light unit 18 provided in the power tool 1 may include the current detection circuit 73 that detects the current supplied to the LED chips 52 and the determination circuit 74 that determines whether the temperature of the chip-on-board light emitting diode 50 exceeds the allowable value based on the detection data of the current detection circuit 73, and the LED control circuit 72 may reduce the amount of light emitted from the LED chips 52 when it is determined that the temperature of the chip-on-board light emitting diode 50 exceeds the allowable value.

Other Embodiments

In the first, second, and third embodiments described above, the impact tool (e.g., the impact tool 1) is an impact driver. The impact tool (e.g., the impact tool 1) may be an impact wrench.

In the above-described embodiment, the power supply of the power tool (e.g., the impact tool 1) may not be the battery pack (e.g., the battery pack 25), and may be a commercial power supply (AC power supply).

In the above-described embodiments, the power tool (e.g., the impact tool 1) is an electric power tool using an electric motor as a power source. The power tool may be a pneumatic tool using an air motor as a power source. The power source of the power tool is not limited to the electric motor or the air motor, and may be another power source. The power source of the power tool may be, for example, a hydraulic motor or a motor driven by an engine.

According to one non-limiting aspect of the present disclosure, an excessive rise in temperature of the chip-on-board light emitting diode is suppressed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A power tool comprising:
    a motor;
    an output shaft that (i) is configured to be rotated by a rotational force of the motor and (ii) has a longitudinal axis in a front-rear direction;
    a chip-on-board light emitting diode radially around the output shaft;
    a heat insulating material (i) directly on at least a part of a periphery of the chip-on-board light emitting diode and (ii) configured to suppress a temperature of the chip-on-board light emitting diode to a predetermined allowable value or less; and
    a heating source that is (i) a component of the power tool and (ii) heated by use of the power tool,
    wherein the heat insulating material is directly between the heating source and the chip-on-board light emitting diode in the front-rear direction.

2. The power tool according to claim 1 wherein the heat insulating material is in direct contact with a rear surface of a substrate of the chip-on-board light emitting diode.

3. The power tool according to claim 1, further comprising:
    a speed reduction mechanism configured to transmit a rotational force of the motor to the output shaft; and
    a gear case that houses the speed reduction mechanism, wherein
    the heating source includes the gear case.

4. The power tool according to claim 3, wherein the heat insulating material is in contact with a substrate of the chip-on-board light emitting diode and the gear case.

5. The power tool according to claim 4, wherein the heat insulating material has a sheet shape.

6. The power tool according to claim 4, wherein the gear case includes:
    a rear cylindrical portion that houses the speed reduction mechanism;
    a front cylindrical portion that holds a bearing that supports the output shaft; and
    an annular portion that connects a front end portion of the rear cylindrical portion and a rear end portion of the front cylindrical portion,
    the chip-on-board light emitting diode is around the front cylindrical portion, and
    the heat insulating material is disposed between the substrate and the annular portion.

7. The power tool according to claim 6, further comprising a case cover that covers a surface of the rear cylindrical portion,
    wherein
    at least a part of the heat insulating material is between the chip-on-board light emitting diode and the case cover.

8. The power tool according to claim 6, wherein
    the substrate includes a circular ring portion,
    an LED chip of the chip-on-board light emitting diode is on a front surface of the circular ring portion, and
    the power tool further comprises a light cover that includes:
        an outer cylindrical portion radially outside the circular ring portion;
        an inner cylindrical portion radially inside the circular ring portion; and
        a light transmission portion that (i) connects a front end portion of the outer cylindrical portion and a front end portion of the inner cylindrical portion and (ii) is configured such that light emitted from the LED chip passes through the light transmission portion.

9. The power tool according to claim 8, wherein the inner cylindrical portion is around the front cylindrical portion and is fixed to the front cylindrical portion.

10. The power tool according to claim 9, wherein
    the front cylindrical portion includes a protrusion protruding radially outward from an outer circumferential surface of the front cylindrical portion,
    the inner cylindrical portion includes a recess, and
    the protrusion is in the recess.

11. The power tool according to claim 3, further comprising an impact mechanism, wherein
    the output shaft includes an anvil,
    the impact mechanism, the motor, the speed reduction mechanism and the anvil are configured such that a rotational force of the motor is transmitted via the speed reduction mechanism to the anvil and impacts the anvil in a rotation direction, and
    the gear case is a hammer case that accommodates the speed reduction mechanism and the impact mechanism.

12. A light unit comprising:
    a chip-on-board light emitting diode;
    a temperature sensor that detects a temperature of the chip-on-board light emitting diode; and
    an LED control circuit configured to (i) determine whether the temperature of the chip-on-board light emitting diode exceeds a predetermined allowable value of the temperature and (ii) reduce an amount of light emitted from an LED chip of the chip-on-board light emitting diode when the LED control circuit determines that the temperature of the chip-on-board light emitting diode exceeds the predetermined allowable value based on detection data of the temperature sensor.

13. The light unit according to claim 12, wherein the temperature sensor is on a substrate of the chip-on-board light emitting diode or on a circuit board on which the substrate is mounted.

14. A light unit comprising:
    a chip-on-board light emitting diode;
    a current detection circuit that detects a current supplied to an LED chip of the chip-on-board light emitting diode;
    a determination circuit configured to determine whether a temperature of the chip-on-board light emitting diode exceeds a predetermined allowable value of the temperature based on detection data of the current detection circuit; and
an LED control circuit configured to reduce an amount of light emitted from the LED chip when the determination circuit determines that the temperature of the chip-on-board light emitting diode exceeds the predetermined allowable value.

15. The light unit according to claim 12, wherein
the LED control circuit is on a substrate of the chip-on-board light emitting diode or on a circuit board on which the substrate is mounted.

16. A floodlight comprising the light unit according to claim 12.

17. A power tool comprising the light unit according to claim 12.

18. The power tool according to claim 1, wherein
the heat insulating material is sandwiched between the heating source and the chip-on-board light emitting diode.

19. The light unit according to claim 14, wherein
the LED control circuit is on a substrate of the chip-on-board light emitting diode or on a circuit board on which the substrate is mounted.

20. A floodlight comprising the light unit according to claim 14.

21. A power tool comprising the light unit according to claim 14.

22. A power tool comprising:
a brushless motor having a longitudinal axis in a front-rear direction;
a motor housing that houses the brushless motor;
a hammer that is configured to be rotated by a rotational force of the brushless motor;
an anvil that (i) is forward of the hammer and (ii) is configured to be impacted by the hammer in a rotational direction;
a hammer case that is made of metal, houses he hammer and supports the anvil;
a chip-on-board light emitting diode (i) around the anvil and (ii) including a substrate, a plurality of LED chips and a phosphor; and
a heat insulating material (i) configured to suppress a rise in temperature of the chip-on-board light emitting diode due to heat transmission from the hammer case and (ii) directly between the chip-on-board light emitting diode and the hammer case in the front-rear direction.

\* \* \* \* \*